United States Patent
Hoshtanar

(10) Patent No.: US 9,612,265 B1
(45) Date of Patent: Apr. 4, 2017

(54) METHODS AND APPARATUS TO DETECT A CONDUCTIVE OBJECT

(75) Inventor: Oleksandr Hoshtanar, Lviv (UA)

(73) Assignee: Cypress Semiconductor Corporation, San Jose, CA (US)

( * ) Notice: Subject to any disclaimer, the term of this patent is extended or adjusted under 35 U.S.C. 154(b) by 318 days.

(21) Appl. No.: 13/242,703

(22) Filed: Sep. 23, 2011

(51) Int. Cl.
*G01R 27/26* (2006.01)
*G01R 17/16* (2006.01)
*G01R 1/30* (2006.01)
*G01R 1/067* (2006.01)
*G01R 1/073* (2006.01)
*G01R 1/18* (2006.01)
*G01Q 70/16* (2010.01)

(52) U.S. Cl.
CPC ...... *G01R 27/2605* (2013.01); *G01R 1/06711* (2013.01); *G01R 1/07307* (2013.01); *G01R 1/30* (2013.01); *G01R 17/16* (2013.01); *G01R 27/26* (2013.01); *G01Q 70/16* (2013.01); *G01R 1/18* (2013.01)

(58) Field of Classification Search
CPC ...... G01R 27/2605; G01R 27/26; G01R 1/30; G01R 17/16; G01R 1/18; G01R 1/06711; G01R 1/07307; G06F 3/044; G06F 2203/04107; G06F 2203/04111; G06F 2203/04112; G06F 3/0414; G06F 2203/04103; G06F 3/0428; G01D 5/24; G01D 5/2417; G01D 5/241; G01L 1/146; F25B 2309/021; G01N 2001/2285; G01Q 70/16; Y10S 977/86
USPC ...... 324/649, 658, 660, 661, 684, 686, 688, 324/690, 519, 750.17, 663; 345/173–178
See application file for complete search history.

(56) References Cited

U.S. PATENT DOCUMENTS

| | | |
|---|---|---|
| 5,279,187 A | 1/1994 | Salmon |
| 5,650,597 A | 7/1997 | Redmayne |
| 6,188,391 B1 | 2/2001 | Seely et al. |
| 6,370,965 B1 | 4/2002 | Knapp |
| 6,452,514 B1 | 9/2002 | Philipp |
| 6,639,315 B2 | 10/2003 | Kazama et al. |
| 7,129,935 B2 | 10/2006 | Mackey |
| 7,663,607 B2 | 2/2010 | Hotelling et al. |

(Continued)

FOREIGN PATENT DOCUMENTS

| | | |
|---|---|---|
| EP | 2214084 A | 8/2010 |
| EP | 2592533 A1 | 5/2013 |

(Continued)

OTHER PUBLICATIONS

International Search Report and Written Opinion of the International Searching Authority for International Application No. PCT/IB2011/003294 mailed Jun. 22, 2012; 11 pages.

(Continued)

*Primary Examiner* — Huy Q Phan
*Assistant Examiner* — Raul Rios Russo

(57) ABSTRACT

A method and apparatus scan a first capacitive sensor element that is located in a first scan region for a presence of a conductive object and then scan a second capacitive sensor element that is located in a second scan region for the presence of the conductive object. The scan of the first capacitive sensor element includes applying a ground voltage to a ground element through the second capacitive sensor element, the ground element located in the first scan region.

20 Claims, 14 Drawing Sheets

(56) References Cited

U.S. PATENT DOCUMENTS

| | | | |
|---|---|---|---|
| 7,755,026 B2 | 7/2010 | Pittel et al. | |
| 7,755,612 B2 | 7/2010 | Park et al. | |
| 7,808,255 B2 | 10/2010 | Hristov et al. | |
| 7,812,827 B2* | 10/2010 | Hotelling | G06F 1/3262 345/156 |
| 7,864,160 B2 | 1/2011 | Geaghan et al. | |
| 7,973,771 B2 | 7/2011 | Geaghan | |
| 8,004,497 B2 | 8/2011 | Xiaoping | |
| 8,004,499 B2 | 8/2011 | Geaghan et al. | |
| 8,059,103 B2 | 11/2011 | Geaghan | |
| 8,174,507 B2 | 5/2012 | Xiaoping | |
| 8,217,916 B2 | 7/2012 | Anno | |
| 8,237,453 B2 | 8/2012 | Badaye et al. | |
| 8,279,187 B2 | 10/2012 | Geaghan | |
| 8,405,633 B2 | 3/2013 | Geaghan | |
| 8,410,795 B1 | 4/2013 | Peng et al. | |
| 8,432,170 B1 | 4/2013 | Walsh | |
| 8,502,796 B1 | 8/2013 | Yilmaz | |
| 8,519,973 B1 | 8/2013 | Xiaoping | |
| 8,531,418 B2 | 9/2013 | Nolting et al. | |
| 8,536,880 B2 | 9/2013 | Philipp | |
| 8,542,215 B2 | 9/2013 | Hanauer | |
| 8,614,690 B2 | 12/2013 | Grunthaner et al. | |
| 8,638,107 B2 | 1/2014 | Schwartz et al. | |
| 8,648,819 B2 | 2/2014 | Philipp | |
| 8,692,799 B1 | 4/2014 | Landry et al. | |
| 8,726,497 B2 | 5/2014 | Geaghan | |
| 8,749,518 B2 | 6/2014 | Kuo | |
| 8,754,662 B1 | 6/2014 | Weng et al. | |
| 8,872,526 B1 | 10/2014 | Hoshtanar et al. | |
| 8,903,679 B2 | 12/2014 | Peng et al. | |
| 9,007,333 B1 | 4/2015 | Wilson et al. | |
| 9,151,790 B1 | 10/2015 | Hoshtanar | |
| 9,207,820 B2 | 12/2015 | Lamont et al. | |
| 9,292,138 B2 | 3/2016 | Gourevitch et al. | |
| 2005/0200799 A1 | 9/2005 | Murai | |
| 2007/0008299 A1 | 1/2007 | Hristov | |
| 2007/0074914 A1 | 4/2007 | Geaghan et al. | |
| 2007/0257894 A1 | 11/2007 | Philipp | |
| 2007/0268265 A1 | 11/2007 | Xiaoping | |
| 2007/0268266 A1 | 11/2007 | Xiaoping | |
| 2007/0291009 A1 | 12/2007 | Wright et al. | |
| 2008/0074398 A1 | 3/2008 | Wright | |
| 2008/0156546 A1 | 7/2008 | Hauck | |
| 2008/0158175 A1 | 7/2008 | Hotelling et al. | |
| 2008/0309633 A1* | 12/2008 | Hotelling et al. | 345/173 |
| 2009/0002396 A1 | 1/2009 | Andrews et al. | |
| 2009/0120697 A1* | 5/2009 | Wilner | H03K 17/962 178/18.06 |
| 2009/0135157 A1 | 5/2009 | Harley | |
| 2009/0159344 A1 | 6/2009 | Hotelling et al. | |
| 2009/0189866 A1 | 7/2009 | Haffenden et al. | |
| 2009/0194344 A1 | 8/2009 | Harley et al. | |
| 2009/0252386 A1 | 10/2009 | Dean et al. | |
| 2009/0267916 A1* | 10/2009 | Hotelling | 345/174 |
| 2009/0273570 A1 | 11/2009 | Degner et al. | |
| 2009/0303196 A1 | 12/2009 | Furukawa | |
| 2010/0026655 A1 | 2/2010 | Harley | |
| 2010/0045614 A1 | 2/2010 | Gray et al. | |
| 2010/0045615 A1 | 2/2010 | Gray et al. | |
| 2010/0045632 A1 | 2/2010 | Yilmaz et al. | |
| 2010/0046561 A1 | 2/2010 | Grant et al. | |
| 2010/0073301 A1 | 3/2010 | Yousefpor et al. | |
| 2010/0079384 A1* | 4/2010 | Grivna | 345/173 |
| 2010/0079402 A1 | 4/2010 | Grunthaner et al. | |
| 2010/0096193 A1 | 4/2010 | Yilmaz et al. | |
| 2010/0110038 A1 | 5/2010 | Mo et al. | |
| 2010/0123670 A1 | 5/2010 | Philipp | |
| 2010/0163394 A1 | 7/2010 | Tang et al. | |
| 2010/0193257 A1 | 8/2010 | Hotelling et al. | |
| 2010/0214233 A1 | 8/2010 | Lee | |
| 2010/0220075 A1* | 9/2010 | Kuo et al. | 345/174 |
| 2010/0252335 A1 | 10/2010 | Orsley | |
| 2010/0253629 A1 | 10/2010 | Orsley | |
| 2010/0253651 A1 | 10/2010 | Day | |
| 2010/0271330 A1 | 10/2010 | Philipp | |
| 2010/0289503 A1 | 11/2010 | Reynolds et al. | |
| 2010/0292945 A1 | 11/2010 | Reynolds et al. | |
| 2010/0295564 A1* | 11/2010 | Reynolds | G06F 3/044 324/686 |
| 2010/0295821 A1 | 11/2010 | Chang et al. | |
| 2010/0301879 A1 | 12/2010 | Philipp | |
| 2010/0302201 A1* | 12/2010 | Ritter et al. | 345/174 |
| 2010/0328228 A1 | 12/2010 | Elias | |
| 2010/0328255 A1 | 12/2010 | Ishizaki et al. | |
| 2011/0006832 A1 | 1/2011 | Land et al. | |
| 2011/0007020 A1 | 1/2011 | Hong et al. | |
| 2011/0018829 A1* | 1/2011 | Peng | G06F 3/044 345/173 |
| 2011/0025629 A1* | 2/2011 | Grivna | G06F 3/0416 345/173 |
| 2011/0025639 A1 | 2/2011 | Trend et al. | |
| 2011/0063251 A1 | 3/2011 | Geaghan et al. | |
| 2011/0095990 A1 | 4/2011 | Philipp et al. | |
| 2011/0115729 A1 | 5/2011 | Kremin et al. | |
| 2011/0141062 A1 | 6/2011 | Yu et al. | |
| 2011/0157050 A1 | 6/2011 | Jang et al. | |
| 2011/0171998 A1 | 7/2011 | Westerman | |
| 2011/0242028 A1 | 10/2011 | Lee et al. | |
| 2011/0279410 A1 | 11/2011 | Han et al. | |
| 2011/0316567 A1* | 12/2011 | Chai | G06F 3/044 324/686 |
| 2012/0044193 A1 | 2/2012 | Peng et al. | |
| 2012/0044197 A1* | 2/2012 | Polishchuk | G06F 3/044 345/174 |
| 2012/0044199 A1* | 2/2012 | Karpin | G06F 3/0416 345/174 |
| 2012/0044201 A1 | 2/2012 | Xiaoping | |
| 2012/0044203 A1 | 2/2012 | Ishizaki et al. | |
| 2012/0062472 A1* | 3/2012 | Yilmaz | 345/173 |
| 2012/0062510 A1 | 3/2012 | Mo et al. | |
| 2012/0092350 A1 | 4/2012 | Ganapathi et al. | |
| 2012/0105355 A1* | 5/2012 | Souchkov | G06F 3/0416 345/174 |
| 2012/0113047 A1 | 5/2012 | Hanauer | |
| 2012/0127099 A1 | 5/2012 | Liu et al. | |
| 2012/0146943 A1 | 6/2012 | Fairley et al. | |
| 2012/0154324 A1 | 6/2012 | Wright et al. | |
| 2012/0169651 A1* | 7/2012 | Chang | 345/174 |
| 2012/0169653 A1* | 7/2012 | Chang | 345/174 |
| 2012/0169655 A1* | 7/2012 | Chang | 345/174 |
| 2012/0169656 A1* | 7/2012 | Chang | 345/174 |
| 2012/0227259 A1 | 9/2012 | Badaye et al. | |
| 2012/0229417 A1 | 9/2012 | Badaye | |
| 2012/0268416 A1 | 10/2012 | Pirogov et al. | |
| 2012/0306802 A1 | 12/2012 | McCracken | |
| 2012/0319974 A1 | 12/2012 | Kim et al. | |
| 2013/0015868 A1 | 1/2013 | Peng | |
| 2013/0027344 A1 | 1/2013 | Choon | |
| 2013/0033451 A1 | 2/2013 | Olson | |
| 2013/0049771 A1 | 2/2013 | Peng et al. | |
| 2013/0080109 A1 | 3/2013 | Peng et al. | |
| 2013/0082719 A1 | 4/2013 | Prendergast et al. | |
| 2013/0100071 A1 | 4/2013 | Wright et al. | |
| 2013/0176277 A1 | 7/2013 | Wang | |
| 2013/0207911 A1 | 8/2013 | Barton et al. | |
| 2013/0207923 A1 | 8/2013 | Mohindra et al. | |
| 2013/0234980 A1 | 9/2013 | Wang | |
| 2013/0242485 A1 | 9/2013 | Ohtani et al. | |
| 2013/0257799 A1 | 10/2013 | Lamont et al. | |
| 2013/0285975 A1 | 10/2013 | Hong et al. | |
| 2014/0009215 A1 | 1/2014 | Prest et al. | |
| 2014/0022202 A1 | 1/2014 | Badaye et al. | |
| 2014/0043279 A1 | 2/2014 | Pedersen et al. | |
| 2014/0043280 A1 | 2/2014 | Cok | |
| 2014/0125361 A1 | 5/2014 | Tevs | |
| 2014/0152580 A1 | 6/2014 | Weaver et al. | |
| 2014/0152610 A1 | 6/2014 | Suwald | |
| 2014/0152919 A1 | 6/2014 | Philipp | |
| 2014/0160374 A1 | 6/2014 | Wang et al. | |
| 2014/0210791 A1 | 7/2014 | Hanauer et al. | |
| 2014/0225839 A1 | 8/2014 | Dunphy et al. | |
| 2014/0354301 A1 | 12/2014 | Trend | |
| 2014/0368750 A1 | 12/2014 | Liao et al. | |

(56) References Cited

U.S. PATENT DOCUMENTS

| | | | |
|---|---|---|---|
| 2015/0002445 | A1 | 1/2015 | Brunet et al. |
| 2015/0002446 | A1 | 1/2015 | Ayzenberg |
| 2015/0002752 | A1 | 1/2015 | Shepelev et al. |
| 2015/0097801 | A1 | 4/2015 | Trend et al. |
| 2015/0130754 | A1 | 5/2015 | Yairi et al. |
| 2015/0280707 | A1 | 10/2015 | Hovden |
| 2015/0349773 | A1 | 12/2015 | Gourevitch et al. |
| 2015/0370369 | A1 | 12/2015 | Kuo et al. |
| 2015/0370396 | A1 | 12/2015 | Hotelling et al. |
| 2015/0378495 | A1 | 12/2015 | Losh |
| 2015/0378498 | A1 | 12/2015 | Huie |
| 2016/0004343 | A1 | 1/2016 | Gourevitch et al. |
| 2016/0011690 | A1 | 1/2016 | Rowe et al. |

FOREIGN PATENT DOCUMENTS

| | | | |
|---|---|---|---|
| KR | 20100032283 A | | 3/2010 |
| KR | 100979910 B1 | | 9/2010 |
| KR | 20100116281 A | | 11/2010 |
| WO | 2008079596 A1 | | 7/2008 |
| WO | 2010062808 A2 | | 6/2010 |
| WO | WO 2011015827 A2 | * | 2/2011 |
| WO | 2011058562 A | | 5/2011 |

OTHER PUBLICATIONS

International Search Report for International Application No. PCT/US11/53649 dated Oct. 30, 2012; 3 pages.
USPTO Final Rejection for U.S. Appl. No. 14/098,057 dated Jun. 19, 2014; 14 pages.
USPTO Non Final Rejection for U.S. Appl. No. 13/241,514 dated Nov. 12, 2013; 11 pages.
USPTO Non-Final Rejection for U.S. Appl. No. 14/098,057 dated Feb. 20, 2014; 19 pages.
USPTO Notice of Allowance for U.S. Appl. No. 13/241,514 dated Feb. 24, 2014; 7 pages.
Written Opinion of the International Searching Authority for International Application No. PCT/US11/53649 dated Mar. 23, 2014; 5 pages.
U.S. Appl. No. 13/241,514 "Accuracy in a Capacitive Sense Array" Tao Peng et al., filed Sep. 23, 2011; 34 pages.
U.S. Appl. No. 14/098,057 "Interleaving Sense Elements of a Capacitive-Sense Array" Oleksandr Hoshtanar et al., filed Dec. 5, 2013; 55 pages.
U.S. Appl. No. 14/297,115 "Sensor Pattern With Signal-Spreading Electrodes" Oleksandr Hoshtanar et al., filed Jun. 5, 2014; 58 pages.
Lee, et al., "A Multi-Touch Three Dimensional Touch-Sensitive Tablet", Computer Systems Research Institute, University of Toronto, Apr. 1985; 5 pages.
SIPO Office Action for Application No. 201180002772.3 dated Jun. 9, 2015; 4 pages.
ST Microelectronics, "Guidelines for Designing Touch Sensing Applications with Surface Sensors", retrieved from http://www.st.com/st-web-ui/static/active/jp/resource/technical/document/application_note/DM00087990.pdf , dated Sep. 30, 2013; 36 pages.
USPTO Non Final Rejection for U.S. Appl. No. 14/297,115 dated Sep. 9, 2014; 16 pages.
USPTO Notice of Allowance for U.S. Appl. No. 13/241,514 dated Apr. 1, 2014; 8 pages.
USPTO Notice of Allowance for U.S. Appl. No. 13/241,514 dated May 13, 2014; 7 pages.
USPTO Notice of Allowance for U.S. Appl. No. 13/241,514 dated Jun. 27, 2014; 7 pages.
USPTO Notice of Allowance for U.S. Appl. No. 13/241,514 dated Aug. 13, 2014; 7 pages.
USPTO Notice of Allowance for U.S. Appl. No. 13/241,514 dated Sep. 18, 2014; 7 pages.
USPTO Notice of Allowance for U.S. Appl. No. 13/241,514 dated Nov. 3, 2014; 4 pages.
USPTO Notice of Allowance for U.S. Appl. No. 14/098,057 dated Jul. 7, 2014; 8 pages.
USPTO Notice of Allowance for U.S. Appl. No. 14/098,057 dated Sep. 16, 2014; 8 pages.
U.S. Appl. No. 14/525,015 "Interleaving Sense Elements of a Capacitive-Sense Array," Oleksandr Hoshtanar, filed Oct. 27, 2014; 56 pages.
Camacho, Oscar, "Designing Touch Sensing Electrodes," Freescale Semiconductor Application Note, Document No. AN3863, Rev. 4, Jul. 2011; 28 pages.
USPTO Advisory Action for U.S. Appl. No. 14/297,115 dated May 7, 2015; 3 pages.
USPTO Final Rejection for U.S. Appl. No. 14/297,115 dated Feb. 18, 2015; 18 pages.
USPTO Non Final Rejection for U.S. Appl. No. 14/297,115 dated Jul. 8, 2015; 22 pages.
USPTO Non Final Rejection for U.S. Appl. No. 14/297,115 dated Sep. 19, 2014; 16 pages.
USPTO Notice of Allowance for U.S. Appl. No. 14/098,057 dated Aug. 15, 2014; 8 pages.
USPTO Notice of Allowance for U.S. Appl. No. 14/297,115 dated Dec. 4, 2015; 9 pages.
Yazici, Serkan, "Suppression of Spurious Modes via Dummy Electrodes and 2% Frequency Shift via Cavity Size Selection for 1 GHz AlN MEMS Contour-Mode Resonators," IEEE Frequency Control Symposium (FCS), May 21-24, 2012, pp. 1-5; 5 pages.
USPTO Non-Final Rejection for U.S. Appl. No. 14/525,015 dated Mar. 25, 2016; 10 pages.
USPTO Notice of Allowance for U.S. Appl. No. 14/525,015 dated Jun. 8, 2016; 12 pages.

* cited by examiner

METHODS AND APPARATUS TO DETECT A CONDUCTIVE OBJECT

TECHNICAL FIELD

The subject matter relates to the field of user input. More specifically, but not by way of limitation, the claimed subject matter discloses techniques for detecting input of a conductive object.

BACKGROUND

Computing devices, such as notebook computers, personal digital assistants, mobile communication devices, portable entertainment devices (e.g., handheld video game devices, multimedia players), and set-top-boxes (e.g., digital cable boxes, digital video disc (DVD) players) may include user interface devices that facilitate interaction between a user and the computing device.

One type of user interface device that has become more common is a touch-sensor device or touch input device that operates by way of capacitance sensing. A touch-sensor device may be in the form of a touchscreen, touch-sensor pad, a touch-sensor slider, or touch-sensor buttons, and may include an array of one or more capacitive sensor elements. Capacitive sensing typically involves measuring a change in capacitance associated with the capacitive sensor elements to determine a presence or position of a conductive object relative to a touch input device. The conductive object may be, for example, a stylus or a user's finger. Measuring changes in capacitance may be challenging when signals indicating the change in capacitance are mixed with noise signals.

BRIEF DESCRIPTION OF THE DRAWINGS

Some embodiments are illustrated by way of example and not limitation in the figures of the accompanying drawings in which.

DETAILED DESCRIPTION

Figure 1:
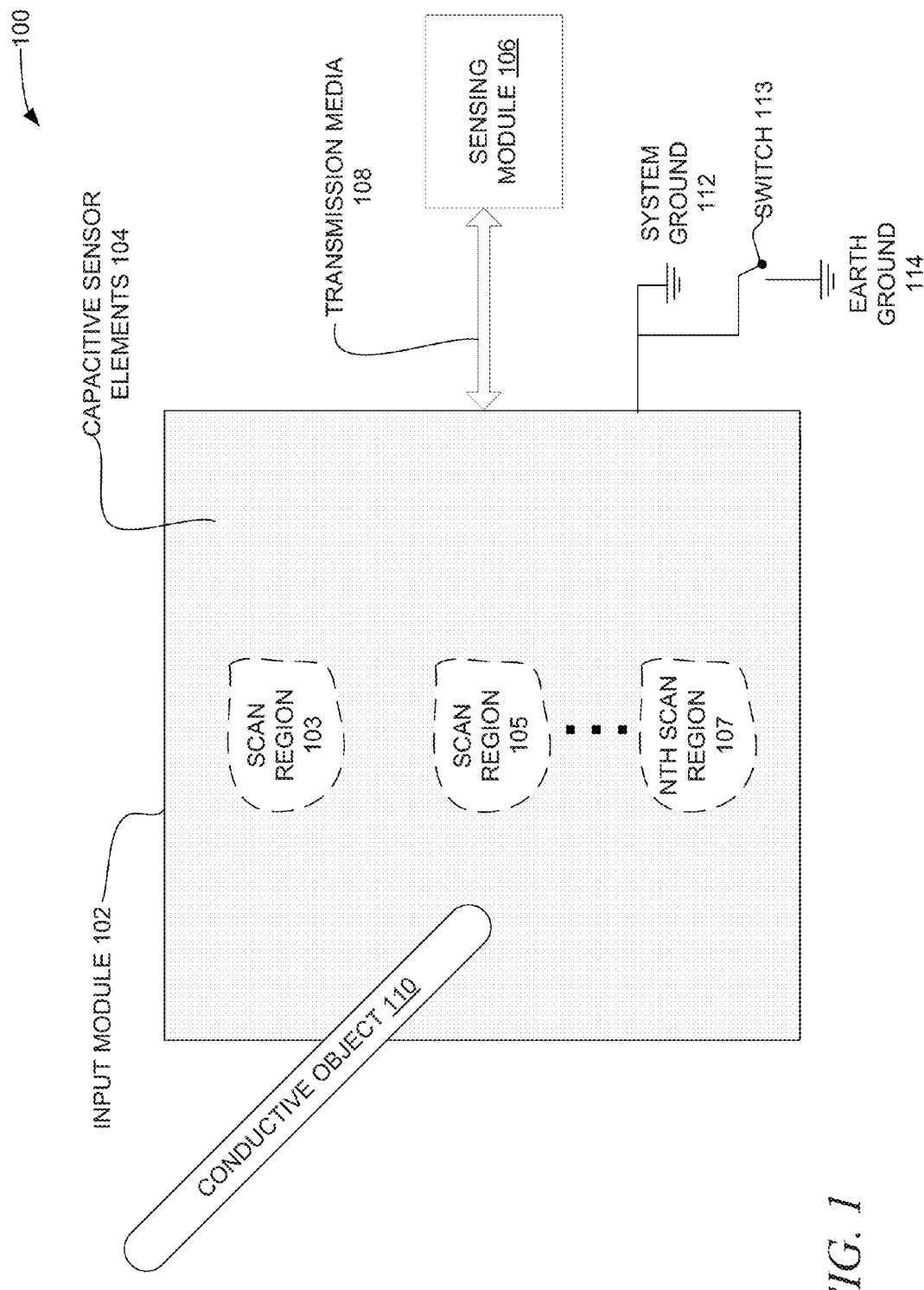
FIG. 1 is a block diagram illustrating an example capacitive sensing system, in accordance with various embodiments.

Methods and apparatus to detect a conductive object are discussed herein. In the following description, for purposes of explanation, numerous specific details are set forth in order to provide a thorough understanding of example embodiments. It will be evident, however, to one skilled in the art that the claimed subject matter may be practiced without these specific details.

The detailed description discuses examples of technology which, among other things, provides a path to drain noise signals that are not useful for detecting a presence of a conductive object (e.g., a finger) proximate to capacitive sensor elements of a touch input device. The conductive object may be a stylus, a finger, or any other conductive object that affects capacitance of a capacitive sensor element. The capacitive sensor elements may be a part of a touchscreen, touchpad, or another input device from which changes in capacitance are detected. Embodiments are briefly introduced and then starting with FIG. 1 and the embodiments are discussed further along with other example embodiments.

In an embodiment, a touchscreen includes capacitive sensor elements organized into scan regions. Each scan region may be scanned by applying a voltage to a capacitive sensor element of the scan region to establish a mutual capacitance with another capacitive sensor element of the scan region. A capacitance signal reflecting the established mutual capacitance can be used to determine whether a finger is proximate to the capacitive sensor elements of a scan region. The capacitance signal may include noise signals that are not useful for detecting the presence of a finger. The noise signals are caused, at least in part, by capacitances between the finger and the capacitive sensor elements of the scan region currently being scanned.

In an embodiment, a ground element is located in one or more of the scan regions. When the scan region is scanned and the ground element is at a ground voltage, the ground element provides a drain path to ground for the noise signals that are not useful for detecting the presence of a finger. In an embodiment, when capacitive sensor elements of a scan region are scanned for presence of a finger, capacitive sensor elements of another scan region that are not being scanned, are at a ground voltage. In an embodiment, the ground element is coupled to a capacitive sensor element that is not being scanned and is not coupled to a ground plane via a through-hole in a transparent substrate of the touchscreen.

As will be described in more detail through embodiments herein, a capacitive sensor element of a scan region that is not being scanned is be used to provide the ground voltage to the ground element in the scan region that is being scanned.

Providing a ground element in a scan region being scanned through a capacitive sensor element of a grounded scan region, as described herein, creates a pathway for noise signals to be drained to ground. This removes noise signals that would otherwise be mixed with useful signal used to detect the presence of a finger. By removing this noise, the signal to noise ratio associated with measured capacitance signals is improved. The improved signal to noise ratio results in improved accuracy in presence detection and position calculation. Measured capacitance signals can then be trusted to have a level of stability such that a need to recheck or resample the measurement is reduced. The resulting time savings allows for a faster position calculation process. Reducing measurement rechecking and/or re-sampling also leads to reduced storage resource consumption, which can further result in reduced power consumption.

The detailed description includes references to the accompanying drawings, which form a part of the detailed description. The drawings show illustrations in accordance with embodiments. These embodiments, which are also referred to herein as "examples," are described in enough detail to enable those skilled in the art to practice embodiments described herein. The embodiments may be combined, other embodiments may be utilized, or structural, logical, and electrical changes may be made without departing from the scope of what is claimed. The following detailed description is, therefore, not to be taken in a limiting sense, and the scope is defined by the appended claims and their equivalents.

FIG. 1 is a block diagram illustrating an example capacitive sensing system 100, in accordance with various embodiments. The capacitive sensing system 100 is shown to include an input module 102 coupled to a sensing module 106. A conductive object 110 is shown to interact with the capacitive sensing system 100. The capacitive sensing system 100 is to detect the presence and/or a calculated position of the conductive object 110.

In various embodiments, the capacitive sensing system 100 may provide the functionality of a touchscreen, a touchpad, a slider, a button, a switch, a level sensor, a proximity sensor, a displacement sensor, a combination thereof, or provide some other functionality based on a detection of the conductive object. In an embodiment, the capacitive sensing system resides in a device that may be held (e.g., in the hand) by a user. In an embodiment, when a user holds the device including the capacitive sensing system 100, the input module 102 and the capacitive sensor elements 104 are coupled to earth ground 114 through the body of the user (e.g., illustrated when the switch 113 connects the input module to earth ground 114).

The input module 102 is to receive input from the conductive object 110. The input module 102 is shown to include capacitive sensor elements 104. In various embodiments, all or a portion of the capacitive sensor elements are organized (e.g., physically or through instructions) into the scan regions 103, 105, and the Nth scan region 107, which as described below, are scanned by the sensing module 106. A capacitance associated with a capacitive sensor element (e.g., of the capacitive sensor elements 104) is affected by the presence of the conductive object 110. The dimensions of the capacitive sensor elements and the conductive object determine how much the conductive object affects the capacitance. As discussed further below, the sensing module 106 obtains capacitance signals reflecting changes in capacitance through scan operations and uses the signals to determine the position of the conductive object.

In some embodiments, the input module 102 includes a touch pad, a touchscreen, or any other interface to receive input from the conductive object 110. The input module 102 may employ projected capacitive technology in which the capacitive sensor elements 104 are formed in one or more capacitive sensor layers upon a substrate (not shown) of the input module 102. For example, the capacitive sensor elements 104 may be patterned in one or more layers of transparent conducting film deposited on a glass substrate. A protective transparent layer (e.g., glass or plastic film) may cover the capacitive sensor elements to shield them from environmental damage. In an embodiment, the thickness of the protective transparent layer is less than 1 millimeter. Through the embodiments described herein, the transparent layer that is less than 1 millimeter thick can be used without sacrificing performance in accuracy, speed, or power consumption associated with detecting the conductive object 110.

The conductive object 110 is to provide input to the input module 102. The conductive object may include any object that affects a capacitance associated with the capacitive sensor elements 104. Examples of the conductive object 110 may include, but not be limited to, a finger or a stylus.

The conductive object 110 may be fixed in position or moveable in position relative to the input module 102. For example, a user may move the conductive object 110 relative to the input module 102. The user may include a human, a mechanism, a machine, and/or programmed instructions. Alternatively or additionally, the input module 102 may be allowed to move relative to a fixed or movable conductive object 110.

The sensing module 106 is to sense whether the conductive object 110 is proximate to or in contact with any of the capacitive sensor elements 104 of the input module 102. To this end, the sensing module 106 may sense the effect of the conductive object 110 on a capacitance associated with the capacitive sensor elements 104.

In one embodiment, the sensing module 106 senses the conductive object 110 through comparing a capacitance of a capacitive sensor element when the conductive object 110 is not present (e.g., not proximate to or in contact with a capacitive sensor element), with the capacitance of the capacitive sensor element when the conductive object 110 is present. As introduced above, to sense the presence of the conductive object 110, the sensing module 106 may perform a scan operation in which each of the capacitive sensor elements 104 are scanned for a change in capacitance.

In the scan operation, the sensing module 106 exchanges energy with the input module 102 through the transmission media 108. The transmission media 108 may include any medium through which the energy may be conveyed. For some embodiments, the transmission media 108 includes metal trace (e.g., copper wire) over which current can flow. Alternatively or additionally, the energy may be propagated over a wireless transmission media.

In one embodiment of a scan operation, the sensing module 106 applies a voltage to one or more of the capacitive sensor elements 104 through the transmission media 108 to form a capacitance. The sensing module 106 may alternatively or additionally detect a current or voltage resulting from a discharge of the one or more of the capacitive sensor elements 104. In various embodiments, the sensing module 106 may measure a self-capacitance of the capacitive sensor elements 104 and/or a mutual capacitance of the capacitive sensor elements 104.

In various embodiments, the sensing module 106 sequentially scans the scan regions 103, 105, and 107. As will be described in more detail with respect to FIG. 2, the sensing module 106 may scan a capacitive sensor element in one scan region (e.g., the scan region 103) while a capacitive sensor element in an adjacent scan region (e.g., the scan region 105) remains at the system ground 112 voltage. The system ground 112 is to provide a low impedance path to a voltage (e.g., a ground voltage). In an embodiment, the voltage of the system ground 112 is an AC fixed voltage.

For some embodiments, the sensing module 106 may process signals indicating the sensed changes in capacitance associated with a capacitive sensor element to calculate position of the conductive object 110 relative to the input module 102. For example, the sensing module 106 may use the signals to determine proximity, position, displacement, movement, and/or to provide other presence related measurements associated with the conductive object 110. Alternatively or additionally, the sensing module 106 may provide the signals to other instructions and/or circuitry (e.g., instructions and/or circuitry of a host) to determine the positional information of the conductive object 110.

A useful signal used by the sensing module 106 to determine changes in capacitance may mix with noise signals that are not useful. The use of a ground element (not shown in FIG. 1) in the scan region 103 of FIG. 1 to reduce the amount of noise signal that mix with useful signals is discussed in more detail with respect to FIG. 2.

Figure 2:
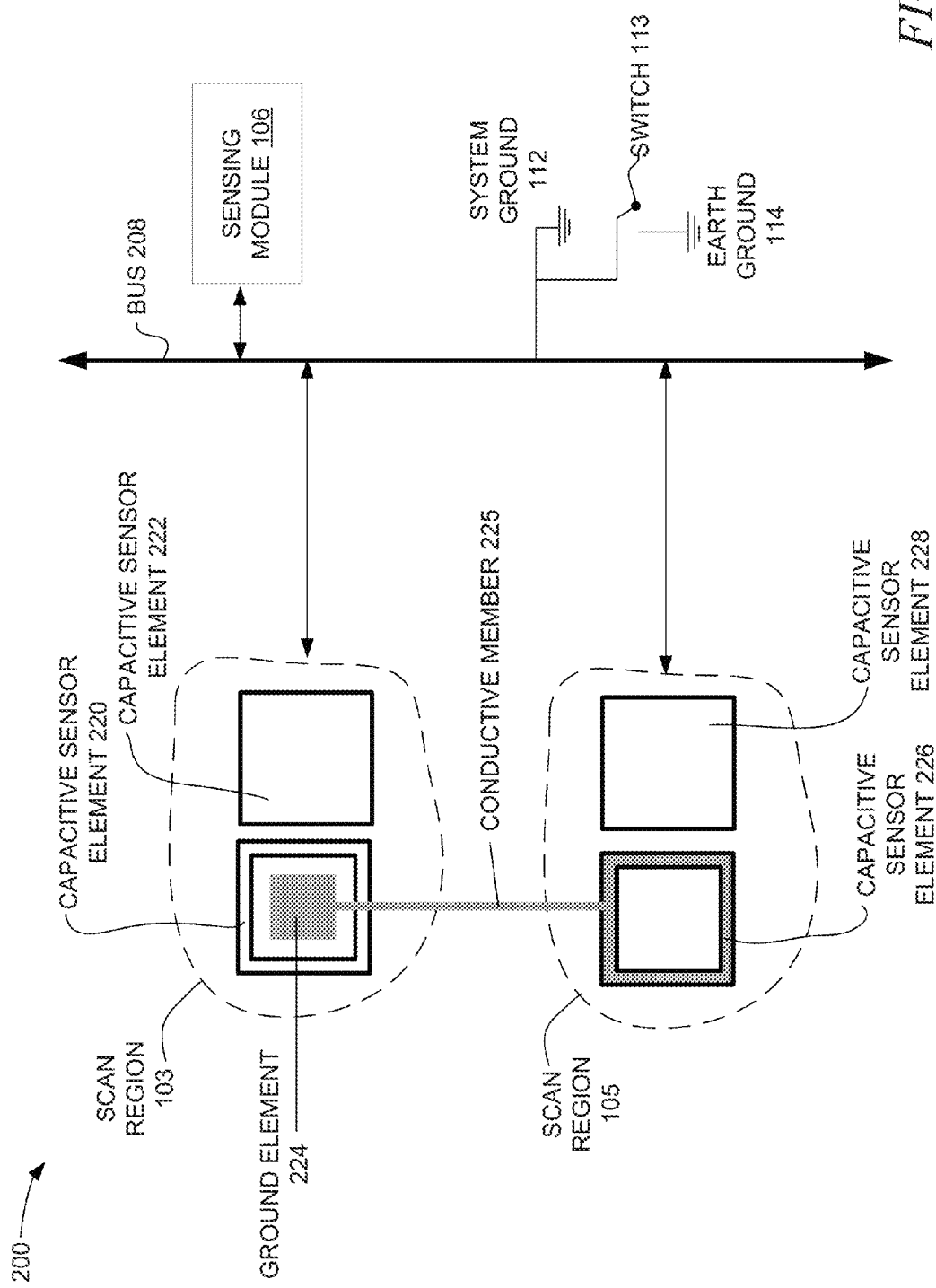
FIG. 2 is a block diagram illustrating scan regions of a capacitive sensing system, in accordance with an embodiment.

FIG. 2 is a block diagram 200 illustrating the scan regions 103 and 105 of the capacitive sensing system 100 of FIG. 1, in accordance with various embodiments. FIG. 2 is shown to include the scan region 103 and the scan region 105 coupled to the sensing module 106 and the system ground 112 of FIG. 1, through a bus 208.

The scan region 103 is shown to include capacitive sensor elements 220, 222, and a ground element 224. The scan region 105 is shown to include the capacitive sensor element 226 and the capacitive sensor element 228. The ground element 224 of the scan region 103 is shown to be coupled through a conductive member 225 to the capacitive sensor element 226 of the scan region 105. When the capacitive sensor element 226 of the scan region 105 is coupled to system ground 112 (e.g., as indicated by the darker shading of the capacitive sensor element 226) or the earth ground 114 through the switch 113, the ground element 224 becomes grounded through the conductive member 225. It will be noted that in this embodiment, the ground element 224 need not be coupled to system ground 112 via any through-hole connection (e.g., through a glass substrate of a touchscreen) to a ground plane of the input module 102 of FIG. 1.

The material (e.g., ITO) of each of the capacitive sensor elements 220, 222, 226, and 228 is shown to form a square shape. The square shape is shown and discussed for the purpose of explanation and not limitation. In this embodiment, the capacitive sensor element 220 of the scan region 103 and the capacitive sensor element 226 of the scan region 105 are formed from the material comprising the outline of the square shape and do not include the space and/or material located interior to the square shape. The capacitive sensor elements 222 and 228 are shown to have a solid surface area but may have the open interior of the capacitive sensor elements 220 and 226 in other embodiments. Solid square and open square shaped capacitive sensor elements are discussed for the purpose of explanation and not limitation. It will be noted that capacitive sensor elements of different shapes and/or patterns may be used in other embodiments without departing from the claimed subject matter. The shape of a capacitive sensor element and/or a ground element may be selected so as to minimize resistance to scan signals and to optimize other conditions that affect scan performance. For example, diamond shaped capacitive sensor elements and ground elements are discussed below (e.g., with respect to FIG. 8).

In FIG. 2, the example ground element 224 is shown to be square in shape and located interior to the outline or border of the square shaped capacitive sensor element 220. The ground element 224 and/or the conductive member 225 may reside in a same plane (e.g., a same substrate layer of the input module 102 of FIG. 1) as the capacitive sensor element 220 or in a different layer than the capacitive sensor element 220. The ground element 224 and the conductive member 225 are to be electrically insulated from the capacitive sensor element 220. In one embodiment, the ground element 224 resides in the same layer as the capacitive sensor element 220 and the conductive member 225 is a jumper that partially resides in another layer.

In other embodiment that is within the scope of the claimed subject matter, a different shaped ground element is electrically insulated from the capacitive elements 220 and 222 and is located elsewhere, within the scan region 103, relative to the capacitive sensor elements 220 and 222. For example, the ground element 224 may be located exterior to the outline or border of the capacitive sensor element 220. In some example embodiments, more than one ground element may be located within a scan region (e.g., see FIG. 10, discussed below).

In an embodiment, the sensing module 106 is scans the capacitive sensor elements 220 and 222 of the scan region 103 while the capacitive sensor elements 226 and 228 of the scan region 105 are at a ground voltage (e.g., a voltage of system ground 112 or earth ground 114). When the capacitive sensor element 226 of the scan region 105 is at the system ground 112 voltage, the ground element 224 coupled to the capacitive sensor element 226 through the conductive member 225 is also at the system ground 112 voltage. Electrical behavior within the scan region 103 is discussed in more detail with respect to FIG. 3, when a finger is not present, and discussed with respect to FIGS. 4 and 5, when a finger is present.

Figure 3:
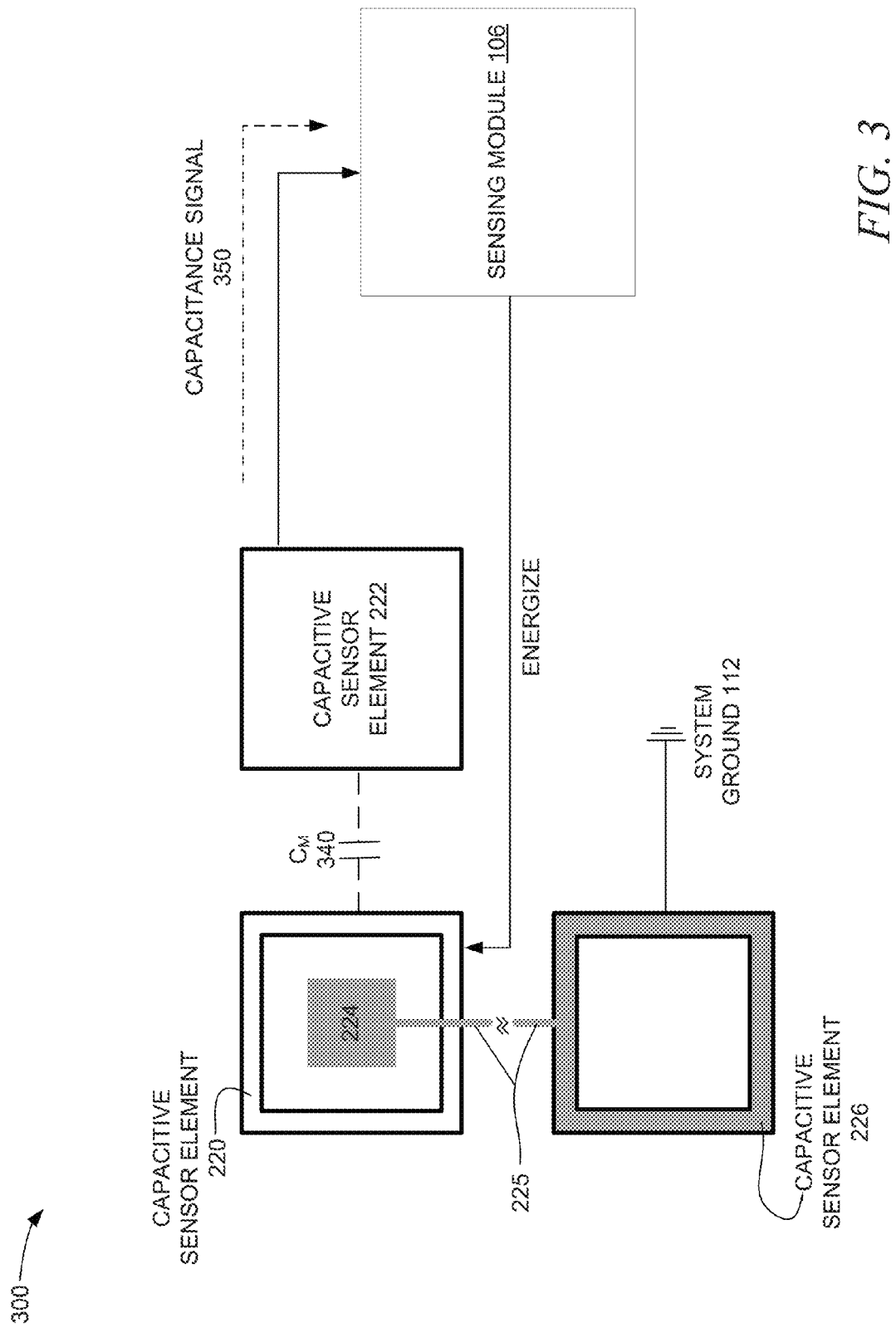
FIG. 3 is block diagram illustrating capacitive sensor elements and a ground element of a scan region, in accordance with an embodiment.

FIG. 3 is block diagram 300 illustrating the capacitive sensor element 220, the capacitive sensor element 222, and the ground element 224 of FIG. 2, in accordance with an embodiment. In an embodiment, the sensing module 106 energizes (e.g., through applying a voltage) the capacitive sensor element 220 through the bus 208 of FIG. 2. An energized capacitive sensor element may be referred to as a transmit (TX) capacitive sensor element. Another part of the scan operation includes the sensing module 106 receiving a capacitance signal 350 from the capacitive sensor element 222 of the scan region 103 through the bus 208 of FIG. 2. A capacitive sensor element from which a capacitance signal is received may be referred to as a receive (RX) capacitive sensor element.

Energizing the capacitive sensor element establishes a mutual capacitance, $C_M$ 340 between the capacitive sensor element 220 and the capacitive sensor element 222. In an embodiment, it is the material of the capacitive sensor element 220 comprising the outline of the square shape that is energized by the sensing module 106 and that forms the mutual capacitance $C_M$ 340 with the capacitive sensor element 222. In an embodiment, when the capacitive sensor elements 220 and 222 of the scan region 103 are scanned, the ground element 224 is coupled to system ground 112 through the capacitive sensor element 226 (e.g., of the scan region 105 of FIG. 2) and the conductive member 225. In an embodiment, the capacitive sensor element 226 and the ground element 224 are not directly coupled to the earth ground 114 of FIG. 2 (e.g., through the body of a user).

When a finger or other conductive object is not proximate to the capacitive sensor elements 220 and 226, the capacitance signal 350 reflects the mutual capacitance $C_M$ 340. Parasitic capacitance (e.g., self-capacitance) may exist between the capacitive sensor element 220 and system ground 112 as well as between the capacitive sensor element 222 and system ground 112. In an embodiment, these capacitances (not shown) have a negligible effect on the capacitance signal 350 received by the sensing module 106.

As will be discussed with respect to FIG. 4, when a finger is proximate to the capacitive sensor elements 220 and 222, a capacitance signal reflects the resulting change in the mutual capacitance $C_M$ 340 but may also reflect, through noise signals, capacitance formed between the finger and the capacitive sensor elements 220 and 222, which can negatively affect a signal to noise ratio of the capacitance signal. When the finger is present, the ground element 224 provides a path to system ground 112 to drain the noise signals that would otherwise mix into the capacitance signal used to detect the presence of the finger.

The ground element 224 is shown to be positioned in the space interior to the shape of the capacitive sensor element 220 (e.g., the transmit (TX) capacitive sensor element). In another embodiment, the ground element 224 may be positioned in a space interior to the shape of the capacitive sensor element 222 (e.g., the receive (RX) capacitive sensor element). Alternatively or additionally, one or more grounded elements of the scan region 103 (e.g., one ground element is shown in FIG. 3) may be positioned within or adjacent to the shapes of the capacitive sensor element 220 (e.g., the receive (RX) capacitive sensor element) and/or the capacitive sensor element 222 (e.g., the transmit (TX) capacitive sensor element). Various example ground element arrangements are discussed below with respect to FIGS. 8-12.

Figure 4:
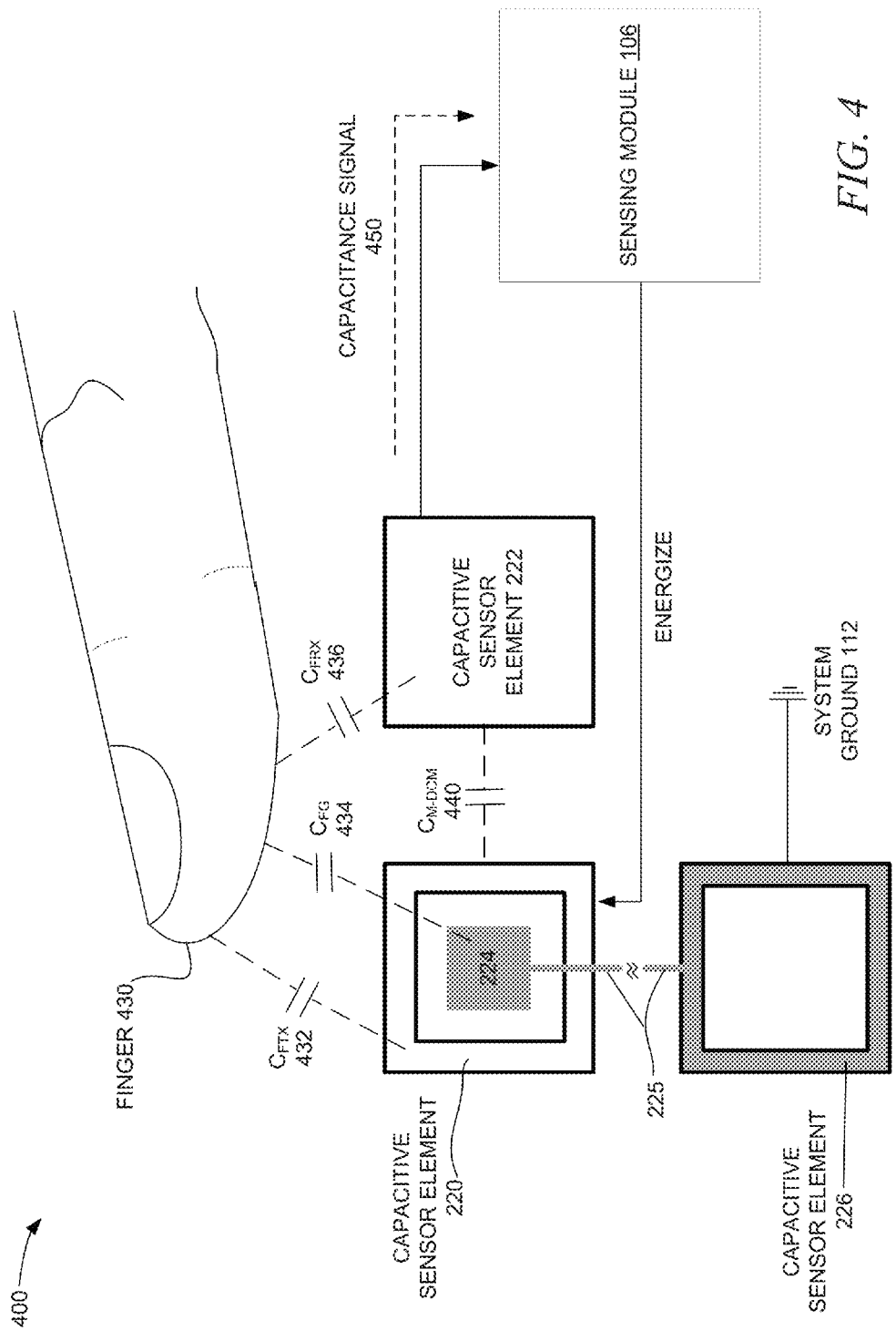
FIG. 4 is block diagram illustrating capacitive sensor elements and a ground element of a scan region, when a finger is proximate to the scan region, in accordance with an embodiment.

FIG. 4 is block diagram 400 illustrating the capacitive sensor element 220, the capacitive sensor element 222, and the ground element 224 of the scan region 103 of FIG. 2 when a finger 430 is proximate to the to the scan region 103, in accordance with an embodiment.

As described above, the sensing module 106 performs a scanning operation including energizing the capacitive sensor element 220 to establish the capacitance $C_M$ 340 of FIG. 3 while coupling the ground element 224 to the system ground 112 voltage through the conductive member 225 and the capacitive sensor element 226. In an embodiment, while the capacitive sensor element 220 is energized and the finger 430 is present, additional capacitors are formed and the capacitance $C_M$ 340 of FIG. 3 is affected.

In an embodiment, the presence of the finger 430 proximate to the capacitive sensor elements 220 and 222 deforms an electric field (not shown) that exists between the capacitive sensor element 220 and the capacitive sensor element 222, reducing the capacitance $C_M$ 340 of FIG. 3 to the capacitance $C_{M-DCM}$ 440 of FIG. 4. In an embodiment, a useful signal portion of a resulting capacitance signal 450 that reflects this change in mutual capacitance is what is used to detect the presence of the finger 430 through the capacitance signal 450.

Also shown in FIG. 4, the presence of the finger 430 may form a capacitor, having a capacitance $C_{FTX}$ 432, between the finger 430 and the capacitive sensor element 220, and may a form capacitor, having a capacitance $C_{FRX}$ 436, between the finger 430 and the capacitive sensor element 222. It should be noted that the reduced surface area of the capacitive sensor element 220 compared to that of the capacitive sensor element 222 may result in a smaller capacitance $C_{FTX}$ 432 than the capacitance $C_{FRX}$ 436. Alternatively or additionally, the capacitive sensor element 222 may have the reduced surface area. In an embodiment, noise signals that reflect and pass through the capacitances $C_{FTX}$ 432 and $C_{FRX}$ 436 can mix into the capacitance signal 450 with the useful signal that reflects the capacitance $C_{M-DCM}$ 440. In an embodiment, the noise signals that reflect the capacitances $C_{FTX}$ 432 and $C_{FRX}$ 436 reduce accuracy in detecting the presence of the finger 430 through the capacitance signal 450.

The presence of the finger 430 may also form a capacitor between the finger and the ground element 224 having a capacitance $C_{FG}$ 434. In an embodiment, the capacitance $C_{FG}$ 434 helps direct all or a portion of the noise signals, which reflect the capacitances $C_{FTX}$ 432 and $C_{FRX}$ 436, away from mixing with the useful signals.

In an embodiment, the capacitance signal 450, the useful signal, and the noise signals are currents. The discussion below of FIG. 5 explains how the current comprising the noise signal can be drained to system ground 112 rather than mixing with the useful current in the capacitance signal 450.

Figure 5:
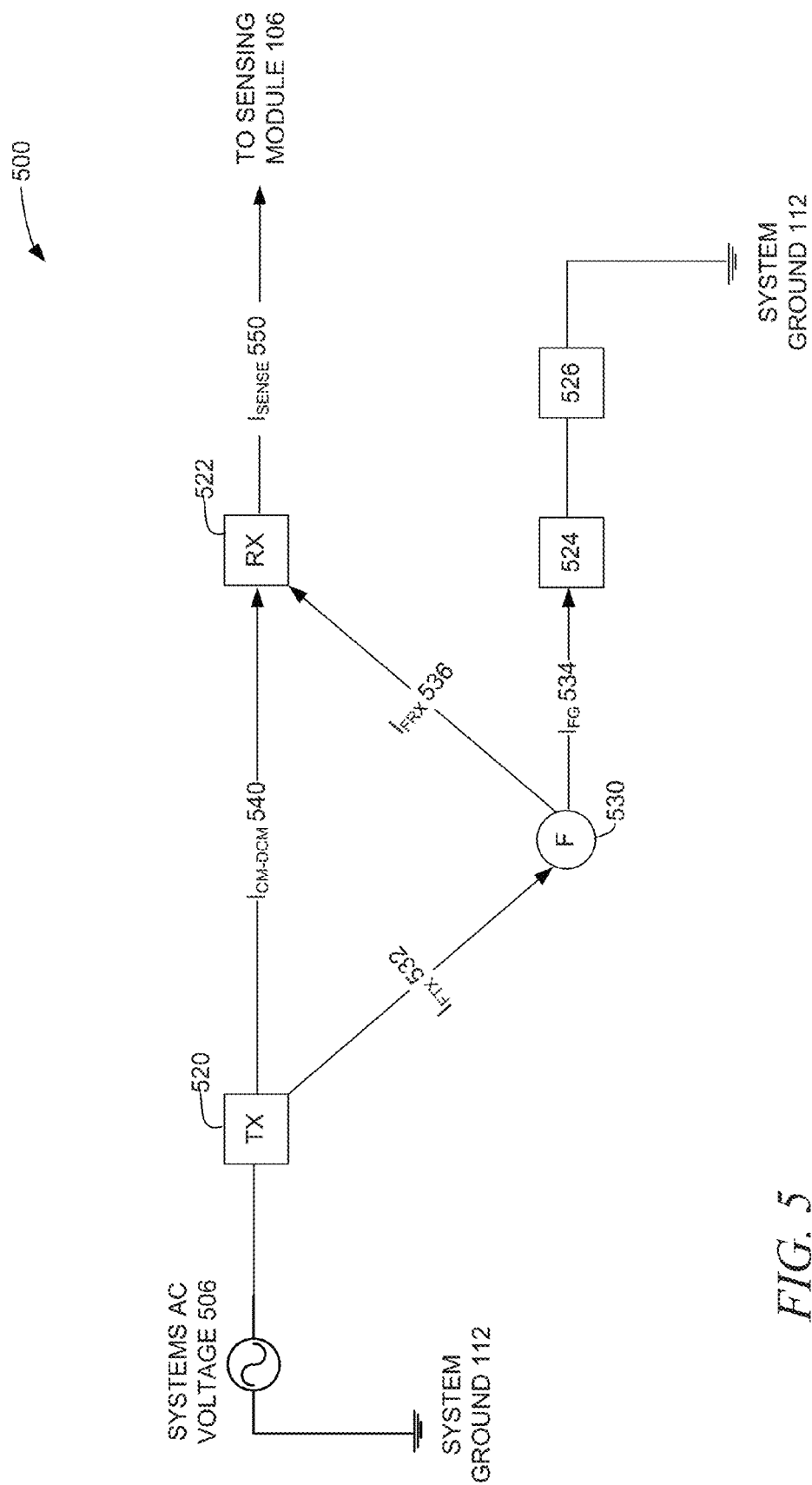
FIG. 5 is a circuit diagram showing example current flow through elements of a scan region when a finger is proximate to the scan region, in accordance with an embodiment.

FIG. 5 is a circuit diagram 500 showing an example current flow through elements of the scan region 103 when a finger is proximate to the scan region 103, in accordance with an embodiment. The circuit diagram 500 is an example electrical model of the example of FIG. 4 where the finger 430 is proximate to the capacitive sensor elements 220, 222 and the ground element 224. The node TX 520 of FIG. 5 represents the capacitive sensor element 220 of FIG. 4. A system AC voltage 506 is shown to be coupled to the system ground 112 and to the TX node 520. In an embodiment, the sensing module 106 of FIG. 4 uses the system AC voltage 506 to excite the capacitive sensor element 220 during the scan operation. The node RX 522 of FIG. 5 represents the capacitive sensor element 222 of FIG. 4 and the node F 530 represents the finger 430 of FIG. 4. The node 524 represents the ground element 224 of FIG. 4, and is shown to be coupled to system ground 112 through the node 526, which represents the capacitive sensor element 226 of FIG. 4.

FIG. 5 is shown to include the currents $I_{CM-DCM}$ 540, $I_{FTX}$ 532, $I_{FRX}$ 536, $I_{FG}$ 534, and $I_{SENSE}$ 550, which flow from nodes of higher electric potential (e.g., voltage) to nodes of lower electric potential.

The current $I_{SENSE}$ 550 represents the capacitance signal 450 of FIG. 4. The current $I_{CM-DCM}$ 540 represents current flowing from the capacitive sensor element 220 into the capacitive sensor element 222 and reflects the capacitance $C_{M-DCM}$ 440. In an embodiment, the current $I_{CM-DCM}$ 540 is the useful portion of $I_{SENSE}$ 550 for detecting the presence of the finger 430 of FIG. 4.

The current $I_{FTX}$ 532 represents current flowing from the capacitive sensor element 220 to the finger 430 and reflects the capacitance $C_{FTX}$ 432. The current $I_{FRX}$ 536 represents current flowing from the finger 430 into the capacitive sensor element 222 and reflects the capacitance $C_{FRX}$ 436 of FIG. 4. In an embodiment, the currents $I_{FTX}$ 532 and $I_{FRX}$ 536, when included in the current $I_{SENSE}$ 550, are noise and not useful for detecting the presence of the finger 430 of FIG. 4.

The current $I_{FG}$ 534 represents current flowing from the finger 430 of FIG. 4 to system ground 112 through the ground element 224 and the capacitive sensor element 226 of FIG. 4, and reflects the capacitance $C_{FG}$ 434 of FIG. 4. In an embodiment, the current $I_{FG}$ 534 reduces the amount of current, $I_{FTX}$ 532 and/or $I_{FRX}$ 536, which mixes into current $I_{SENSE}$ 550 with the useful current, $I_{CM-DCM}$ 540.

Applying Kirchhoff's Current Law at the node RX 522, $$I_{SENSE} = I_{CM-DCM} + I_{FRX} \quad (1).$$

Applying Kirchhoff's Current Law at the node F 530, $$I_{FRX} = I_{FTX} - I_{FG} \quad (2).$$

Substituting equation (2) into equation (1), $$I_{SENSE} = I_{CM-DCM} + (I_{FTX} - I_{FG}) \quad (3).$$

Equation (2) shows that the current $I_{FTX}$ 532 flowing to the node F 530 can be drained to the system ground 112 via the current $I_{FG}$ 534 through the node 524 (e.g., the ground element 224 of FIG. 4) and the node 526 (e.g., the capacitive sensor element 226 of FIG. 4). As can be seen in equation (3), the larger the current $I_{FG}$ 534 the less current $I_{FTX}$ 532 is added with the useful current $I_{CM-DCM}$ 540 to comprise the current $I_{SENSE}$ 550.

Figure 6:
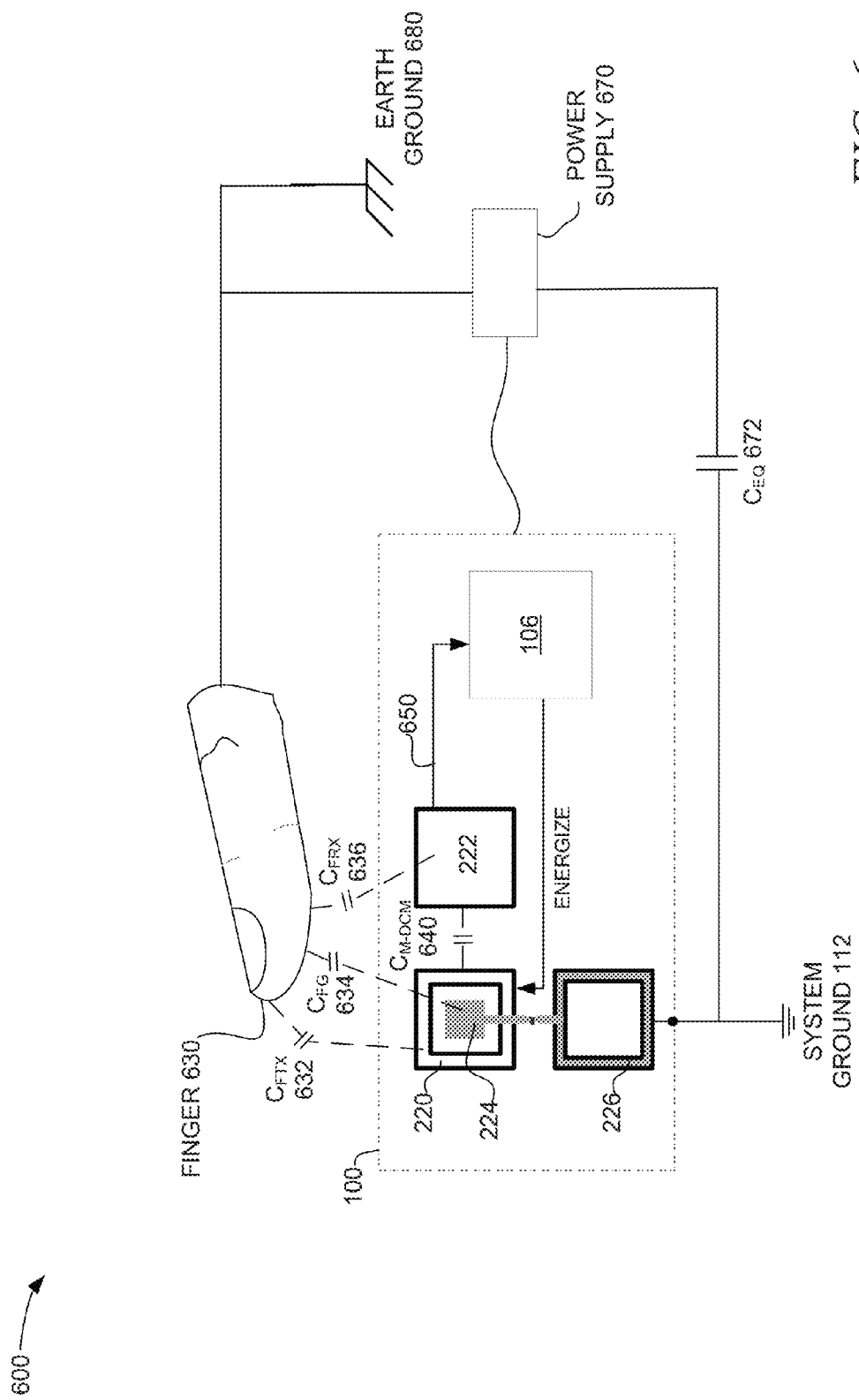
FIG. 6 is a block diagram showing a power supply coupled to a capacitive sensing system when a finger is proximate to a scan region, in accordance with an embodiment.
Figure 7:
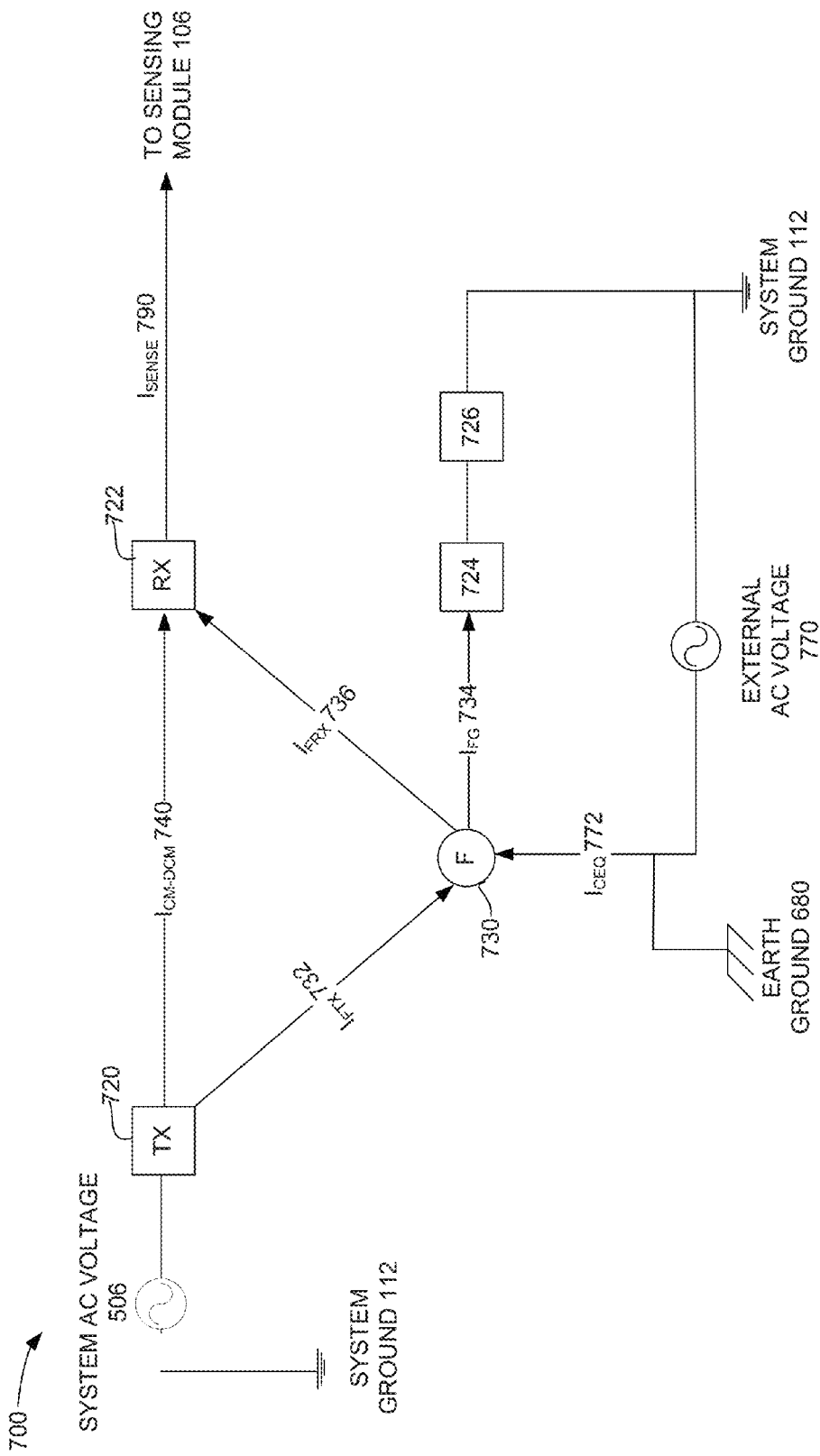
FIG. 7 is a circuit diagram showing example current flow through elements of a scan region when a power supply is coupled to the capacitive sensing system, and a finger is proximate to the scan region, in accordance with an embodiment.

In this way, noise that worsens the signal to noise ratio of the current signal $I_{SENSE}$ 550 can be removed from the current $I_{SENSE}$ 550. The improved signal to noise ratio results in improved accuracy in presence detection and position calculation. FIGS. 6 and 7 introduce an example environment of the capacitive sensing system 100 of FIG. 1 in which an unintended capacitance is generated that introduces a noise signal, which can be mitigated through the ground element described herein.

FIG. 6 is a block diagram showing a power supply 670 coupled to a capacitive sensing system 100 when a finger 630 is proximate to the capacitive sensor elements 220 and 222 of the scan region 103 of FIG. 2, in accordance with an embodiment.

The capacitive sensor system 100 is shown to be coupled to system ground 112, while the power supply 670 and the finger 630 are shown to be coupled to earth ground 680. In an embodiment, the capacitive sensor system 100 is not directly coupled to the earth ground 680 (e.g., through the body of a human user). The sensing module 106 may scan the capacitive sensor element 220 and 222 to receive a capacitance signal 650. In an embodiment, the capacitances $C_{M-DCM}$ 640, $C_{FTX}$ 632, $C_{FRX}$ 636, and $C_{FG}$ 634 associated with the capacitive sensor element 220, the capacitive sensor element 222, the capacitive sensor element 226, and the ground element 224 are analogous to the capacitances $C_{M-DCM}$ 440, $C_{FTX}$ 432, $C_{FRX}$ 436, and $C_{FG}$ 434 described with respect to FIG. 4.

The power supply 670 may include a charger to charge an energy storage (not shown, e.g., a rechargeable battery) used to power capacitive sensing system 100. The charger may include primary and secondary transformer windings, an interference suppressing capacitor connected between common busses of the primary and secondary windings, and an impulse inverter having voltage that is a source of noise in a capacitance signal. The AC voltage of the charger may vary amplitude and frequency according to the load of the energy storage.

When the power supply, having an external AC voltage, is electrically coupled to the capacitive sensing system 100, an equivalent capacitance $C_{EQ}$ 672 may be formed between the power supply 670 and the system ground 112. The AC external voltage may be an equivalent voltage of the power supply 670 that is applied to the capacitive sensing system 100 and is a source of noise. The equivalent capacitance $C_{EQ}$ 672 represents an equivalent representation of multiple capacitances associated with components of the power supply 670. In an embodiment discussed with respect to FIG. 7, the capacitance $C_{EQ}$ 672 is reflected through a current that is not useful to the sensing module 106 for detection of the finger.

FIG. 7 is a circuit diagram 700 showing example current flow through elements associated with the scan region 103 of FIG. 2 when the power supply of FIG. 6 is coupled to the capacitive sensing system 100 and the finger 630 of FIG. 6 is present, in accordance with an embodiment.

The circuit diagram 700 is an example electrical model of the example of FIG. 6 where the power supply 670 is coupled to the capacitive sensing system 100 when the finger 630 is present. The nodes TX 720, RX 722, F 730, 724, and 726, and are the same or similar to the nodes TX 520, RX 522, F 530, 524, and 526 described above with respect to FIG. 5. The currents $I_{CM-DCM}$ 740, $I_{FTX}$ 732, $I_{FRX}$ 736, $I_{FG}$ 734, and $I_{SENSE}$ 750 of FIG. 7 are analogous to the currents $I_{CM-DCM}$ 540, $I_{FTX}$ 532, $I_{FRX}$ 536, $I_{FG}$ 534, and $I_{SENSE}$ 550 described with respect to FIG. 5. The system AC voltage 506 and the system ground 112 are the same or similar to those of FIG. 5.

The external AC voltage 770 represents the AC voltage of the power supply 670 described with respect to FIG. 6. The earth ground 680 of FIG. 7 is the same or similar to that of FIG. 6. The current $I_{CEQ}$ 772 represents current flowing from the external AC voltage 770 of the power supply 670 of FIG. 6 into the finger 630 and reflects the capacitance $C_{EQ}$ 672 of FIG. 6. In an embodiment, the current $I_{CEQ}$ 772, when included in the current $I_{SENSE}$ 790, is a noise signal that is not useful for detecting the presence of the finger 630 of FIG. 6.

Applying Kirchhoff's Current Law at the node F 730 of FIG. 7, $$I_{FRX} = I_{FTX} + I_{CEQ} - I_{FG} \quad (4).$$

Substituting equation (4) into equation (1), $$I_{SENSE} = I_{CM-DCM} + (I_{FTX} + I_{CEQ} - I_{FG}) \quad (5).$$

As can be seen from equation (5), the currents $I_{FTX}$ 732 and $I_{CEQ}$ 772, which if mixed with the current $I_{SENSE}$ 790, would each represent noise signals in the current $I_{SENSE}$ 790 can be decreased when the ground element 224 is coupled to system ground 112 through the capacitive sensor element 226 during scanning of the capacitive sensor elements 220 and 222. Through this use of the ground element 224, when a power supply is coupled to the capacitive sensing system 100, the signal to noise ratio associated with measured capacitance signals can be maintained at an acceptable level and/or improved, which results in acceptable and/or improved accuracy in presence detection and position calculation. As discussed with respect to FIG. 3, embodiments may include different shapes and patterns of capacitive sensor elements and ground elements. Several variations are now described below with respect to FIGS. 8-12.

Figure 8:
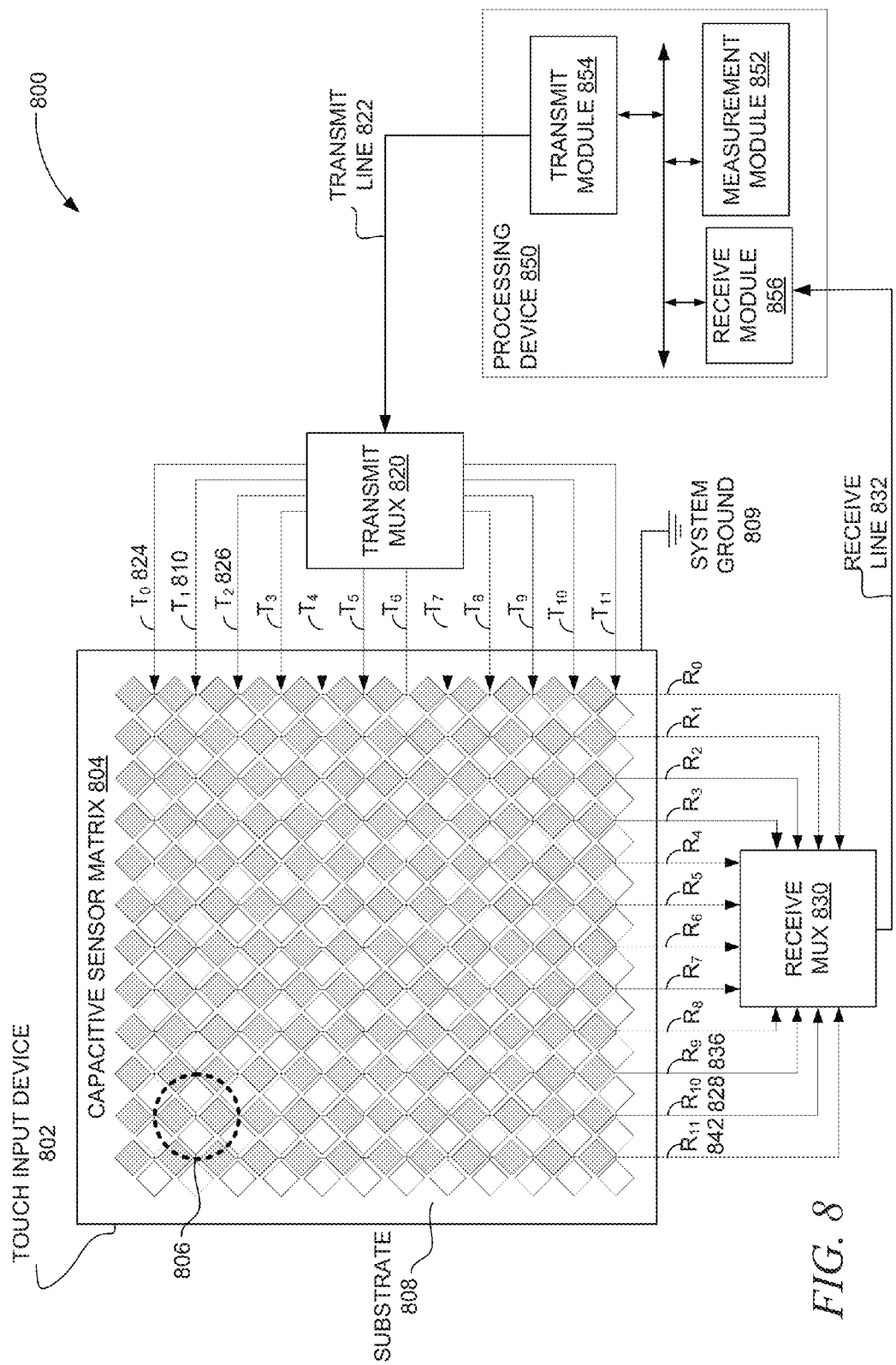
FIG. 8 is a block diagram illustrating an example capacitive sensing system, in accordance with various embodiments.

FIG. 8 is a block diagram illustrating an example capacitive sensing system 800, in accordance with various embodiments. The capacitive sensing system 800 is shown to include a touch input device 802 coupled with a processing device 850. The touch input device 802 is an example of the input module of FIG. 2 and may be a touch-sensor pad, a touch-screen display, a touch-sensor slider, a touch-sensor button, or other device. The touch input device 802 is shown to be coupled to system ground 809. In an embodiment, the touch input device is not directly coupled to an earth ground (not shown) through a user.

The touch input device 802 is shown to include capacitive sensor elements arranged in a capacitive sensor matrix 804. The capacitive sensor matrix 804 is shown to reside upon a substrate 808. In an embodiment, the substrate 808 is non-conductive. The capacitive sensor elements of the capacitive sensor matrix 804 may be formed from ITO. An ITO layer including the capacitive sensor elements may be positioned over a display area (e.g., in a touch-screen display) and protected with a protective layer. All or a portion of the capacitive sensor elements may include ground elements, as discussed above, that are not coupled to system ground 809 (e.g., a ground plane) via through-holes of the substrate 808.

The capacitive sensor matrix 804 is shown to include capacitive sensor elements arranged in rows and columns (e.g., defining a two-dimensional grid) that can be used to detect the proximity, touch, position, and/or movement of a conductive object (e.g., a user's finger).

The rows of capacitive sensor elements in the capacitive sensor matrix 804 are shown to be coupled to transmit traces $T_0$-$T_{11}$, which are shown to be coupled with the processing device 850 through a transmit multiplexer (MUX) 820 and a transmit line 822. The columns of capacitive sensor elements in capacitive sensor matrix 804 are shown to be coupled to receive traces $R_0$-$R_{11}$, which are shown to be coupled with the processing device 850 through the receive MUX 830 and a receive line 832.

The processing device 850 is shown to include transmit module 854, a receive module 856, and a measurement module 852. Various embodiments of the processing device 850 are described below with respect to FIG. 14. The transmit module 854, the receive module 856, and the measurement module 852 may provide the functionality of the sensing module of FIG. 1. In various embodiments, the transmit module 854, receive module 856, and/or the measurement module 852 are implemented with hardware, software, or a combination of the two.

The measurement module 852 is to measure changes in capacitance associated with the capacitive sensor elements of the capacitive sensor matrix 804. It will be noted that the measurement module 852 may use any of various known methods for measuring capacitance. By way of example and not limitation, the measurement module 852 may use relaxation oscillator methods, provide current versus voltage phase shift measurements, measure resistor-capacitor charge timing, and/or utilize a capacitance bridge divider, charge transfer, successive approximation, sigma-delta modulation, charge-accumulation circuits, field effect, mutual capacitance, and/or frequency shift techniques. For some embodiments, the measurement module 852 may direct the operation of the transmit module 854 and the receive module 856 through control signals.

The transmit module 854 is to provide a portion of a scan operation that includes energizing capacitive sensor elements of the capacitive sensor matrix 804. For some embodiments, the transmit module 854 may energize the capacitive sensor elements through a scanning voltage. The receive module 856 is to provide a portion of the scan operation that includes obtaining a capacitance signal from energized capacitive sensor elements that may be used to detect the presence of a conductive object. In an embodiment, the capacitive sensor matrix includes multiple scan regions that are scanned by the processing device 850. The encircled area 806 may include capacitive sensor elements of one of the multiple scanned regions. In an embodiment, the measurement module 852 may compare the capacitance established through the energized capacitive elements with an expected capacitance to determine whether a conductive object is proximate to or in contact with capacitive sensor elements of the encircled area 806.

In an embodiment, the processing device 850 controls the transmit MUX 820 to select an appropriate row of capacitive sensor elements to be energized. Likewise, the processing device 850 may control the receive MUX 830 to so that the receive module 856 receives a capacitance signal from the appropriate column of the capacitive sensing matrix 804. The designation of rows and columns to include the excited and sensed capacitive sensor elements is merely one example, and in other embodiments, the designation may be reversed.

In an embodiment, the capacitive sensing system 800 operates using a mutual capacitance sensing technique, where a mutual capacitance may be formed at the intersection of two capacitive sensor elements in the capacitive sensor matrix 804. A conductive object proximate to the intersection may cause a change in this mutual capacitance. The change in capacitive may be measured by the measurement module 852. The measurement module 852 or another module and/or circuit may use the measured change in capacitance to determine a location or position of the conductive object relative to the capacitive sensor matrix 804.

In an embodiment of mutual capacitance sensing, the capacitive sensor elements within the encircled area 806 are excited by the transmit module 854 with a voltage through the transmit line 822, the transmit MUX 820, and the transmit trace $T_1$ 810. In an embodiment, the capacitive sensor elements along the transmit traces $T_0$ 824 and $T_2$ 826 are at a system ground 809 voltage while the transmit module is exciting the capacitive sensor elements along the transmit trace $T_1$ 810. During the scanning operation, the receive capacitive sensor elements within the encircled area may be sensed by the receive module 856 through the receive line 832, the receive MUX 830, and the receive trace $R_{10}$ 828. In an embodiment, the capacitive sensor elements along one or more of the receive traces $R_9$ 836 and $R_{11}$ 842 are at the system ground 809 voltage while the receive module 856 is sensing the capacitive sensor elements along the receive trace $R_{10}$ 828. Examples discussed below with respect to FIGS. 9-12, which relate to capacitive sensor elements in the encircled area 806, may be applicable to other capacitive sensor elements of the capacitive sensor matrix.

As described above with respect to FIG. 2, the transmit capacitive sensor element and/or the receive capacitive sensor elements associated with the scan region 103 may include ground elements, which during scanning, are coupled to a ground voltage through one or more other capacitive sensor elements. In various embodiments, ground elements (not shown in FIG. 8) of the encircled area 806 may be coupled to system ground 809 through capacitive sensor elements along a grounded transmit and/or receive trace. Various example patterns of capacitive sensor elements that include ground elements are discussed with respect to FIGS. 9-12.

Figure 9:
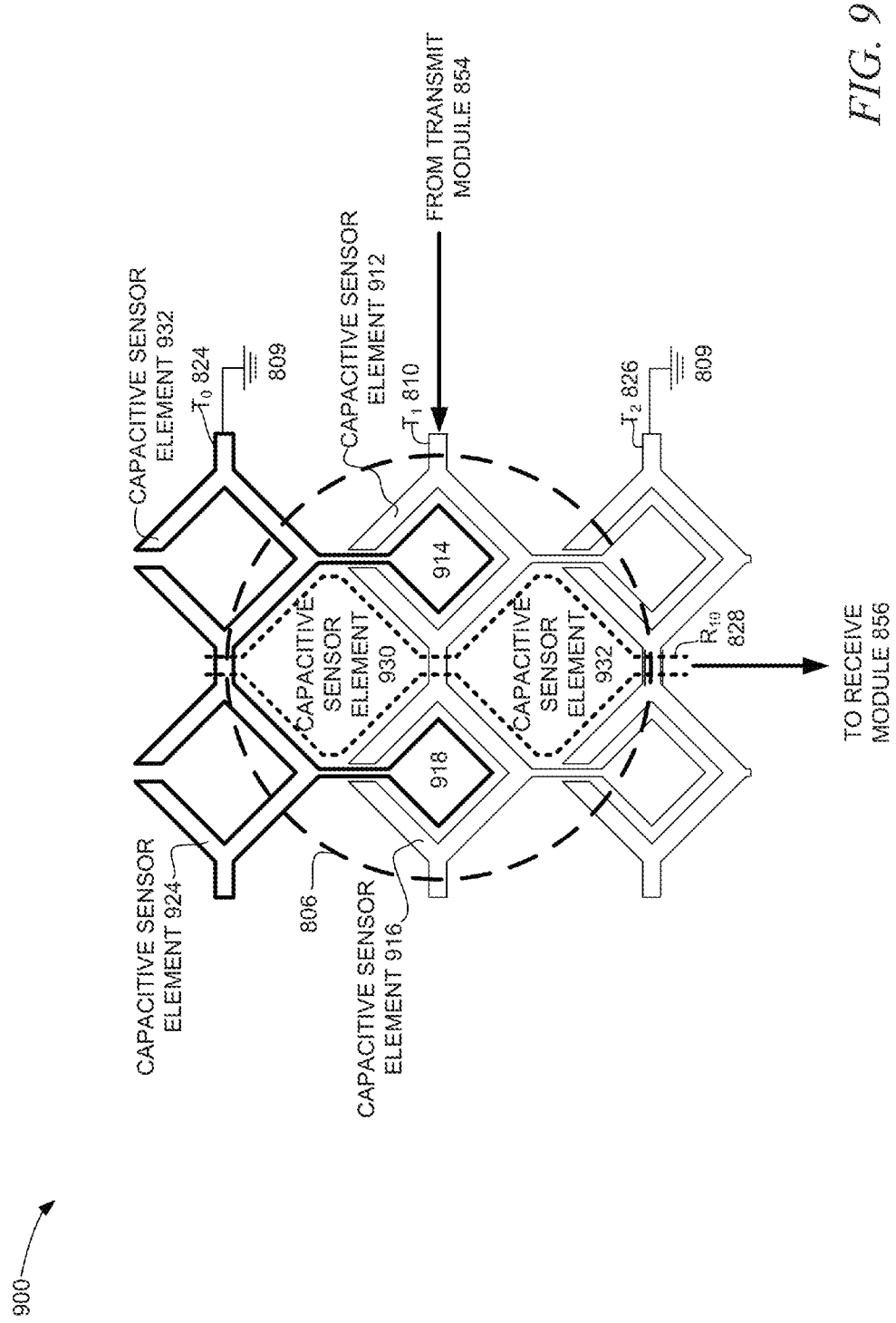
FIG. 9 is a block diagram showing an example pattern of a capacitive sensor matrix, including ground elements, in accordance with an embodiment.

FIG. 9 is a block diagram showing an example pattern of the capacitive sensor matrix 804 of FIG. 8, including ground elements, in accordance with an embodiment. The encircled area 806 is shown to include the capacitive sensor elements 912 and 916 along the T1 810 trace and the capacitive sensor elements 930 and 932 along the $R_{10}$ 828 trace. The encircled area 806 is also shown to include the ground element 914 and the ground element 918. The ground element 914 is shown to be coupled to the capacitive sensor element 932 while the ground element 918 is shown to be coupled to the capacitive sensor element 924.

In an embodiment, the capacitive sensor elements 912, 916, 930, 932 and the ground elements 914 and 918 comprise a scan region scanned by the processing device 850 of FIG. 8. When the transmit module 854 of FIG. 8 energizes the capacitive sensor elements 912 and 916 along the $T_1$ 810 trace, the capacitive sensor elements along the $T_0$ 824 trace and the $T_2$ 826 trace remain at the system ground 809 voltage until they are subsequently scanned. When the transmit module 854 energizes the capacitive sensor elements 912 and 916, mutual capacitances are established with the capacitive sensor elements 930 and 932 along the $R_{10}$ 828 trace. The receive module 856 of FIG. 8 is to receive the capacitance signal (e.g., a current) reflecting the mutual capacitances.

When a conductive object such as a finger is present above the capacitive sensor elements within the encircled area 806, the mutual capacitances just discussed are decreased and capacitances are established between the finger and each of the capacitive sensor elements 912, 916, 930, and 932. A capacitance is also established between the finger and the ground elements 918 and 914. The receive module 856 is to receive the capacitance signal (e.g., a current) reflecting the changes in mutual capacitances and the newly established capacitances.

As described with respect to FIGS. 4 and 5, capacitances $C_{FTX}$ 432 and $C_{FRX}$ 436 formed between the finger 430 and capacitive sensor elements 220 and 222 in the scan region 103 result in current components $I_{FTX}$ 532 and $I_{FRX}$ 536, which are noise signals (e.g., parasitic symbols) that can mix with $I_{SENSE}$ 550. In the discussion of FIG. 5 and equation (3) above, it was shown that some of the current $I_{FTX}$ 532 could be drained through the current $I_{FG}$ 534 to the system ground 112 via a ground element 224 of the scan region 103 (e.g., through capacitive sensor element 226 of the scan region 105).

Returning to FIG. 9, the currents reflecting capacitances of the finger and each of the capacitive sensor elements 912, 916, 930, and 932 can be mitigated in the same or similar way as described above with respect to FIG. 5 and equation (3). For example, noise due to the capacitances between a finger and scanned capacitive sensor elements 912 and 930 can be drained to system ground 809 through the ground element 914 and the capacitive sensor element 922 so that capacitance signals received by the receive module better reflects the change in mutual capacitance of the capacitive sensor elements 912 and 930.

Figure 10:
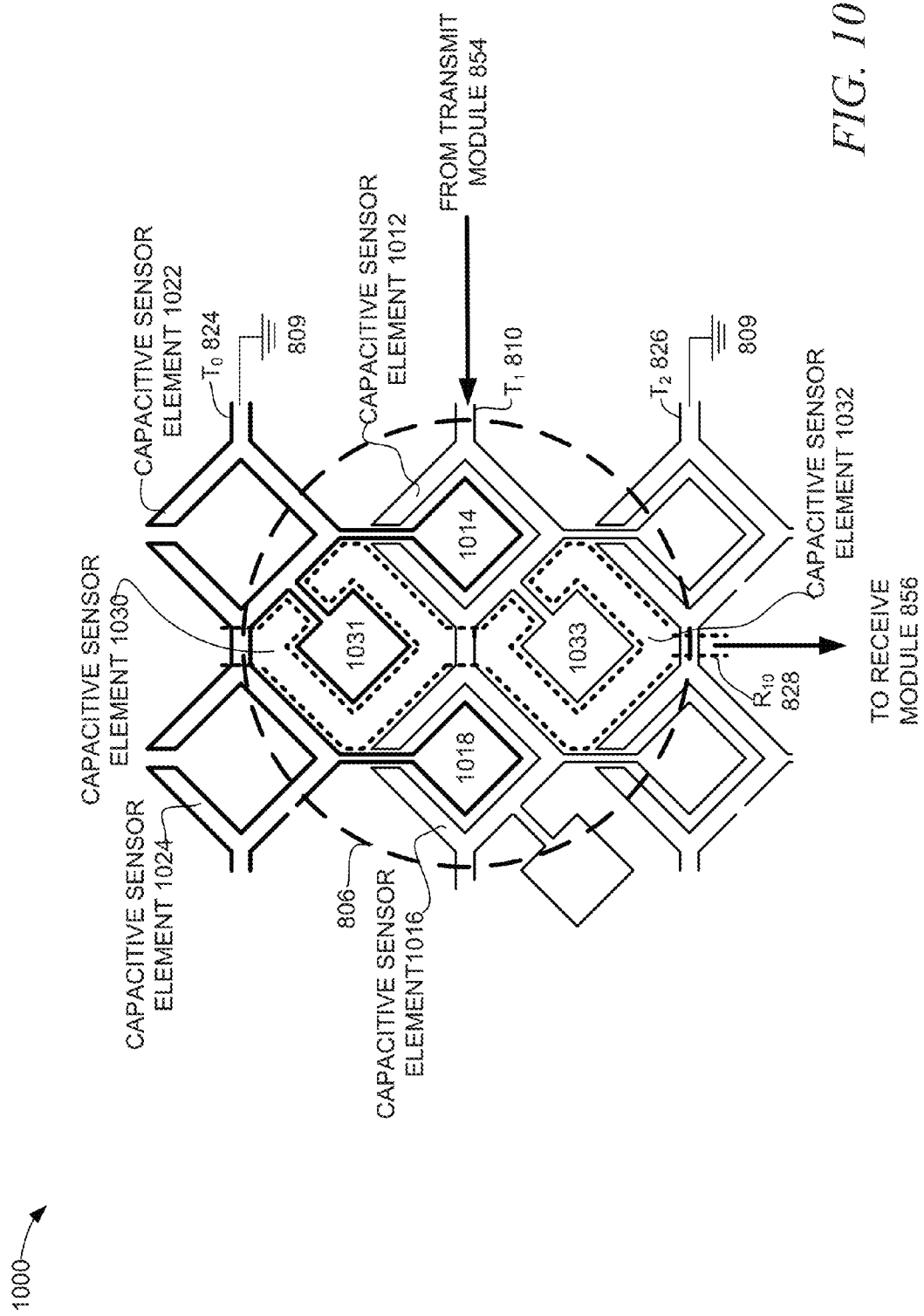
FIG. 10 is a block diagram showing another example pattern of a capacitive sensor matrix, including ground elements, in accordance with an embodiment.

FIG. 10 is a block diagram showing another example pattern of a capacitive sensor matrix 804 of FIG. 8, including ground elements, in accordance with an embodiment. The encircled area 806 is shown to include the capacitive sensor elements 1012 and 1016 along the T1 810 trace and the capacitive sensor elements 1030 and 1032 along the $R_{10}$ 828 trace. The encircled area 806 is also shown to include the ground elements 1014, 1018, 1031, and 1033. The ground elements 1014 and 1031 are shown to be coupled to the capacitive sensor element 1022, the ground element 1018 is shown to be coupled to the capacitive sensor element 1024, and the ground element 1033 is shown to be coupled to the capacitive sensor element 1012.

In an embodiment, the capacitive sensor elements 1012, 1016, 1030, and 1032, and the ground elements 1014, 1018, 1031, and 1033 comprise a scan region scanned by the processing device 850 of FIG. 8. When the transmit module 854 of FIG. 8 energizes the capacitive sensor elements along the T1 810 trace, the capacitive sensor elements along the $T_0$ 824 trace and the $T_2$ 826 trace remain at the system ground 809 voltage until they are subsequently scanned. When the transmit module 854 energizes the capacitive sensor elements 1012 and 1016 mutual capacitances are established with the capacitive sensor elements 1030 and 1032 along the $R_{10}$ 828 trace. It may be noted that the ground element 1033 may be energized through the capacitive sensor element 1012. The receive module 856 is to receive the capacitance signal (e.g., a current) reflecting the mutual capacitances.

When a conductive object such as a finger is present above the capacitive sensor elements within the encircled area 806, the mutual capacitances just discussed are decreased and capacitances are established between the finger and each of the capacitive sensor elements 1012, 1016, 1030, and 1032. A capacitance is also established between the finger and the ground elements 1014, 1018, 1031, and 1033. It should be noted that the open shape of the capacitive sensor elements 1012, 1016, 1030, and 1032 may result in reduced capacitances with the finger. The receive module 856 is to receive the capacitance signal (e.g., a current) reflecting the changes in mutual capacitances and the newly established capacitances. Although the energized ground element 1033 may form a capacitor with the finger and surrounding capacitive sensor elements, the effect on positional accuracy has been observed to be acceptably small in an embodiment.

Current associated with the capacitances formed between the finger and each of the capacitive sensor elements 1012, 1016, 1030, and 1032 can be mitigated in the same or similar way as discussed above with respect to FIG. 5 and equation (3). For example, noise due to the capacitances between a finger and scanned capacitive sensor elements 1012 and 1030 can be drained to system ground 809 through the ground elements 1014 and 1031 and the capacitive sensor element 1022 so that capacitance signals received by the receive module 856 better reflect the change in mutual capacitance of the capacitive sensor elements 1012 and 1030. In this embodiment, more noise may be allowed to drain through the three ground elements 1014, 1018, and 1031 compared to an embodiment with two ground elements (e.g., see FIG. 9).

Figure 11:
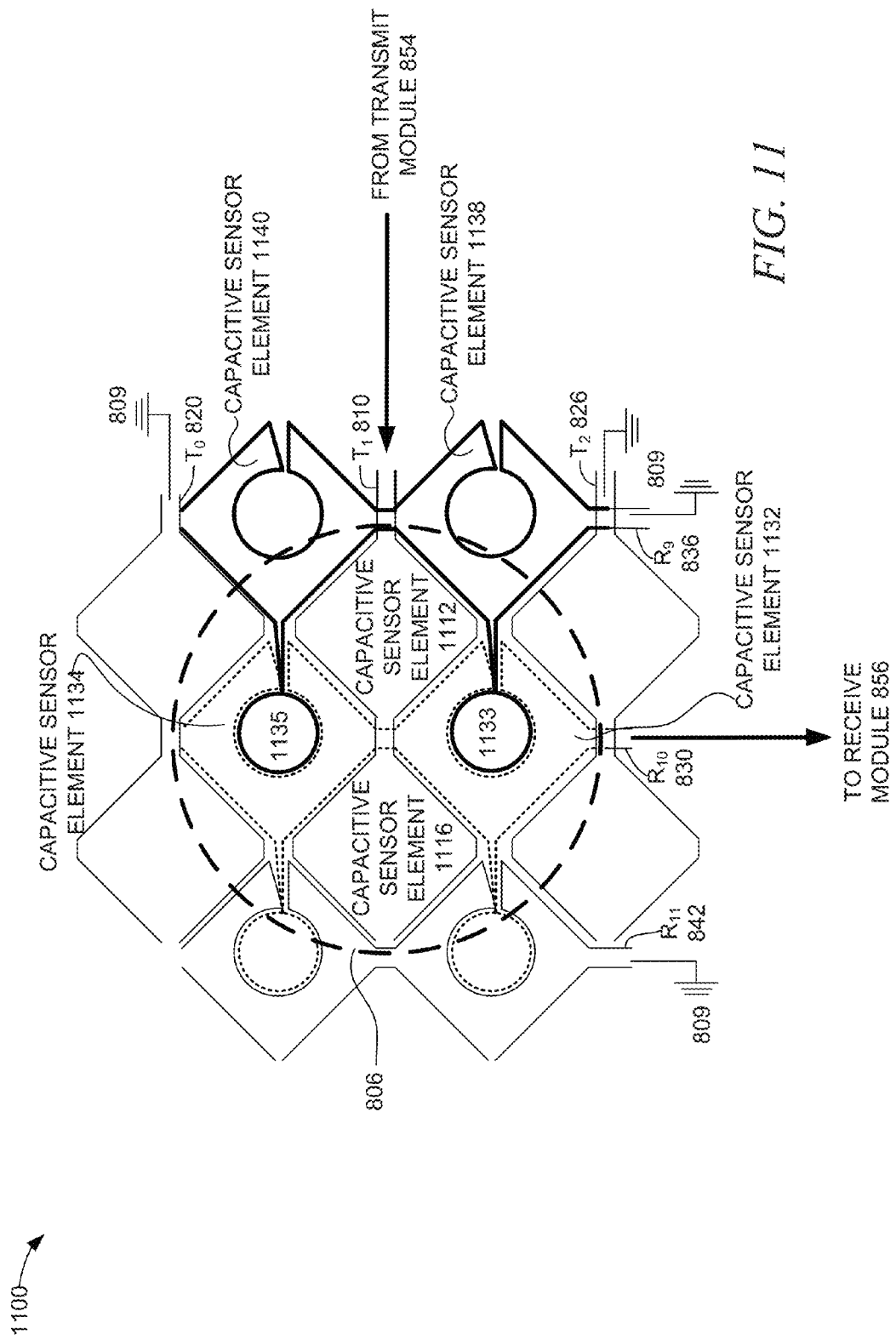
FIG. 11 is a block diagram showing another example pattern of a capacitive sensor matrix, including ground elements, in accordance with an embodiment.

FIG. 11 is a block diagram showing another example pattern of a capacitive sensor matrix 804 of FIG. 8, including ground elements, in accordance with an embodiment. The encircled area 806 is shown to include the capacitive sensor elements 1112 and 1116 along the T1 810 trace and the capacitive sensor elements 1132 and 1134 along the $R_{10}$ 828 trace. The encircled area 806 is also shown to include the ground element 1133 and the ground element 1135. The ground element 1133 is shown to be coupled to the capacitive sensor element 1138 while the ground element 1135 is shown to be coupled to the capacitive sensor element 1140.

In an embodiment, the capacitive sensor elements 1112, 1116, 1132, and 1134 as well as the ground elements 1133 and 1135 comprise a scan region scanned by the processing device 850 of FIG. 8. When the transmit module 854 of FIG. 8 energizes the capacitive sensor elements 1112 and 1116 along the $T_1$ 810 trace, the capacitive sensor elements along the $T_0$ 824 trace and the $T_2$ 826 trace remain at the system ground 809 voltage. When the transmit module 854 energizes the capacitive sensor elements 1112 and 1116 mutual capacitances are established with the capacitive sensor elements 1132 and 1134 along the $R_{10}$ 828 trace. The receive module 856 of FIG. 8 is to receive the capacitance signal (e.g., a current) reflecting the mutual capacitances through the $R_{10}$ 828 trace. When the receive module 856 receives the capacitance signal (e.g., a current) reflecting the mutual capacitances, the capacitive sensor elements along the $R_9$ 836 and $R_{11}$ 843 traces remain at the system ground 809 voltage.

When a conductive object such as a finger is present above the capacitive sensor elements within the encircled area 806, the mutual capacitances just discussed are decreased and capacitances are established between the finger and each of the capacitive sensor elements 1112, 1116, 1132, and 1134. A capacitance is also established between the finger and the ground elements 1133 and 1135. The ground elements 1133 and 1135 are shown to be coupled to the system ground 809 through the capacitive sensor elements 1138 and 1140, respectively. The receive module 856 is to receive the capacitance signal (e.g., a current) reflecting the changes in mutual capacitances and the newly established capacitances.

Current associated with the capacitances formed between the finger and each of the capacitive sensor elements 1112, 1116, 1132, and 1134 can be mitigated in the same or similar way as described above with respect to FIG. 5 and equation (3). For example, the noise signals due to the capacitances between a finger and scanned capacitive sensor elements 1112, 1134 can be drained to system ground 809 through the ground element 1135 and the capacitive sensor elements 1140 so that capacitance signals received by the receive module 856 better reflect the change in mutual capacitance of the capacitive sensor elements 1112 and 1134.

Figure 12:
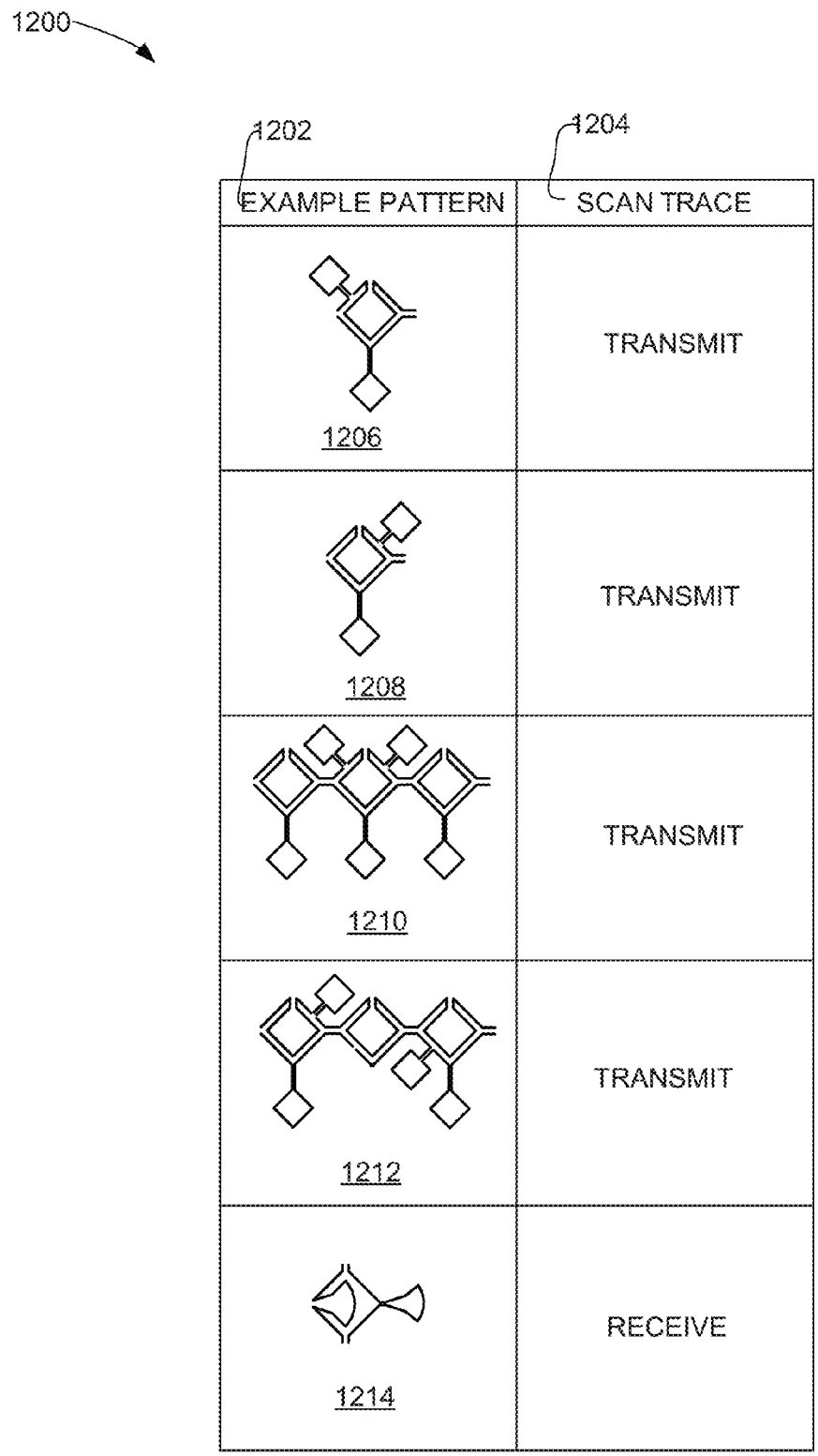
FIG. 12 is a chart showing various additional example patterns of a capacitive sensor matrix, including ground elements, in accordance with various embodiments.

FIG. 12 is a chart 1200 showing various additional example patterns of the capacitive sensor matrix 804, including ground elements, in accordance with various embodiments. The column 1202 is shown to include various example patterns of capacitive sensor elements coupled to ground elements that may be implemented in the capacitive sensor matrix 804 of FIG. 8. The column 1204 indicates whether a corresponding pattern is to be grounded through a transmit trace (e.g., the $T_2$ 826 trace of FIG. 8) or through a receive trace (e.g., the $R_{11}$ 842 trace of FIG. 8).

When these capacitive sensor elements are at the system ground 809 voltage, they provide a grounded element to an energized scan region. Noise signals may be drained to ground through the ground elements as described herein. The patterns 1206, 1208, 1210, and 1212 are example transmit (TX) capacitive sensor elements with extended ground element, while the pattern 1214 is an example receive (RX) capacitive sensor element with an extended ground element.

Figure 13:
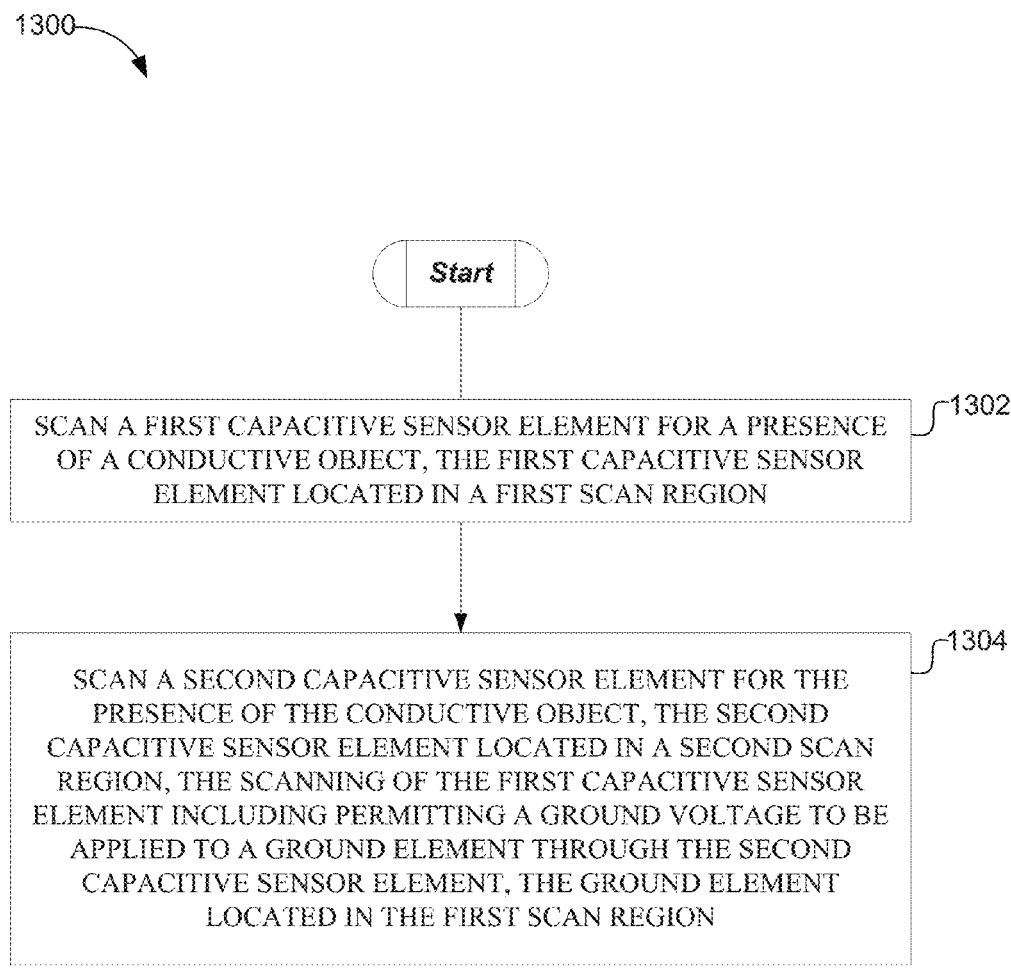
FIG. 13 is a flow diagram illustrating a method for scanning capacitive sensor elements, in accordance with an example embodiment.

FIG. 13 is a flow diagram illustrating a method 1300 for scanning capacitive sensor elements, in accordance with an example embodiment. A description of the method 1300 refers to components of FIGS. 2, 4, 5, and 10 for the purpose of explanation and not to limit the claimed subject matter. It will be noted that the methods described herein may be performed by hardware, software, or a combination of hardware and software.

At block 1302, the method 1300 may include the sensing module 106 of FIG. 2 scanning a first capacitive sensor element (e.g., the capacitive sensor element 220 or the capacitive sensor element 222) for a presence of a conductive object, the first capacitive sensor element located in a first scan region (e.g., the scan region 103 of FIG. 2).

In an embodiment, while the sensing module 106 scans the capacitive sensor element 220, the sensing module 106 permits the system ground 112 to be applied to the ground element 224, of the scan region 103, through the second capacitive sensor element 226. In an embodiment, the capacitive sensor element 226 is coupled to system ground 112 in the absence of any applied voltage and the sensing module 106 may refrain from applying a higher voltage than the system ground 112 voltage to the capacitive sensor element 226, while the sensing module 106 is scanning the scan region 103. Some embodiments include a scan region including multiple ground elements coupled to a system ground through a capacitive sensor element (e.g., see the ground elements 1014 and 1031 of FIG. 10 coupled to the capacitive sensor element 1022 of FIG. 10).

In an embodiment, a mutual capacitance between the capacitive sensor element 220 and the capacitive sensor element 222 of FIG. 4 is established responsive to the sensing module 106 scanning the scan region 103. For example, the sensing module 106 may apply a scan voltage that is greater than the voltage of system ground 112 to the capacitive sensor element 220 to establish the mutual capacitance. In an embodiment, the sensing module 106 receives the capacitance signal 450 of FIG. 4 reflecting the mutual capacitance in the scan region 103. For example, the capacitance signal 450 may be a composite current (e.g., the current $I_{SENSE}$ 550) received from the capacitive sensor element 222. $I_{SENSE}$ 550 may include a first current reflecting the mutual capacitance between the capacitive sensor element 220 and the capacitive sensor element 222 when the conductive object is present. $I_{SENSE}$ 550 may also include a second current t (e.g., the current $I_{FRX}$ 532 and/or the current $I_{FTX}$ 536) minus a third current (e.g., the current $I_{FG}$ 534). In an embodiment, the second current reflects the capacitance $C_{FTX}$ 432 between the finger 430 of FIG. 4 and the capacitive sensor element 220 and the capacitance $C_{FRX}$ 436 between the finger 430 and the capacitive sensor element 222, and the third current reflects the capacitance $C_{EG}$ 434 between the finger 430 and the ground element 224 coupled to the system ground 112 voltage.

Returning to FIG. 13, at block 1304, the method 1300 may include the sensing module 106 scanning a second capacitive sensor element (e.g., the capacitive sensor element 226 or 228 of FIG. 2) for the presence of the conductive object, the second capacitive sensor element located in a second scan regions (e.g., the scan region 105). In an embodiment, while the sensor module 106 scans the capacitive sensor element (e.g., the capacitive sensor element 226 and/or 228) of the scan region 105, the sensing module 106 permits the system ground 112 to be applied to the capacitive sensor element (e.g., the capacitive sensor element 220 and/or 222) of the scan region 103.

Providing a ground element in a scanned region through a capacitive sensor element of a grounded scan region, as described herein, creates a pathway for noise signals to be drained to ground. This removes noise that would otherwise be mixed into a capacitance signal with signals that are useful for detecting the presence of a conductive object. By removing this noise, the signal to noise ratio associated with measured capacitance signals is improved. The improved signal to noise ratio results in improved accuracy in presence detection and position calculation. Capacitance signal can then be trusted to have a level of stability such that a need to recheck or resample the capacitance signal is reduced. The resulting time savings provide for a faster position calculation process. Reducing measurement rechecking and/or re-sampling also leads to reduced storage resource consumption, which can further result in reduced power consumption.

Figure 14:
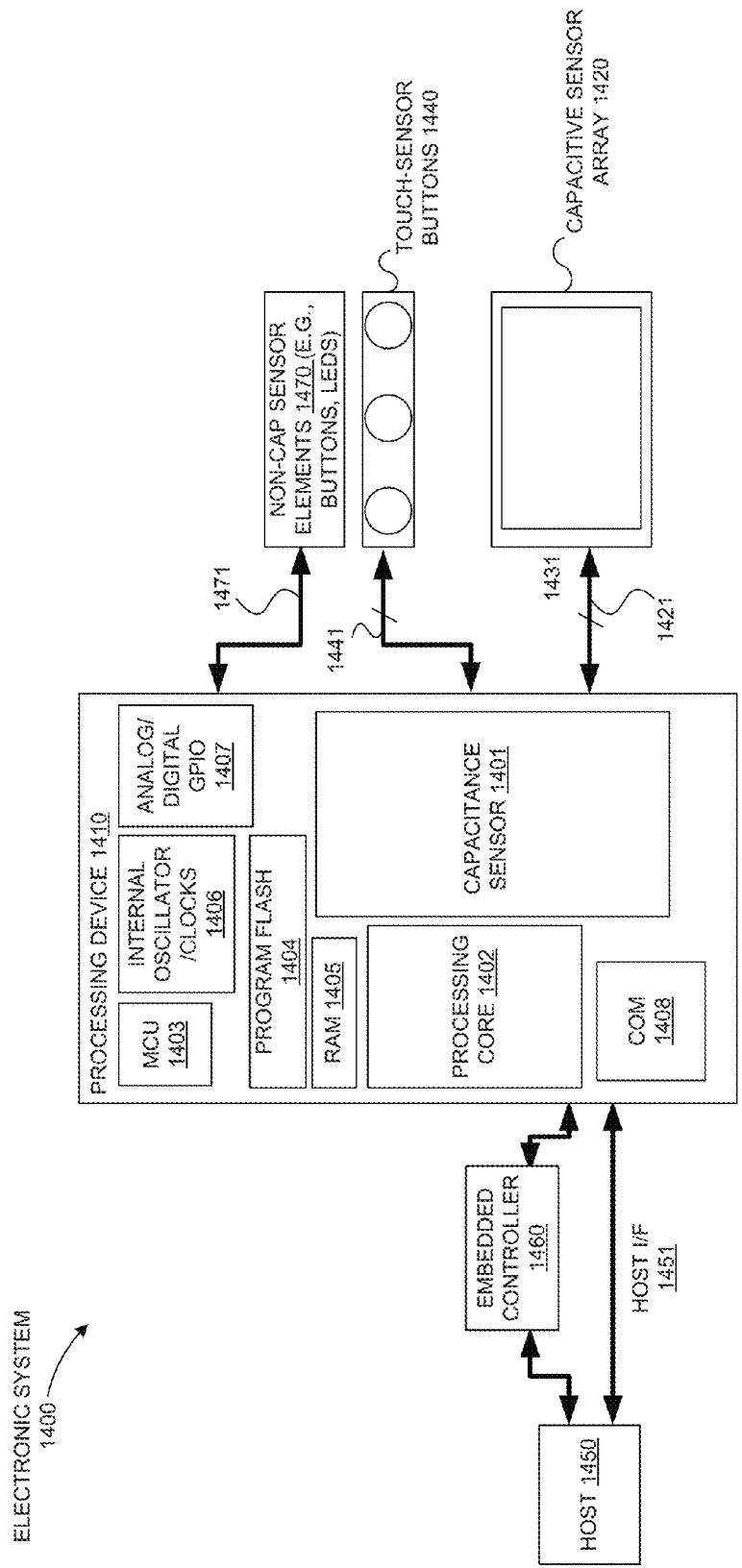
FIG. 14 is a block diagram illustrating an electronic system to detect a presence of a conductive object on a capacitive sensor array, in accordance with various embodiments.

FIG. 14 is a block diagram illustrating an electronic system 1400 to detect a presence of a conductive object on a capacitive sensor array 1420, in accordance with various embodiments.

The electronic system 1400 includes a processing device 1410, the capacitive sensor array 1420, touch-sensor buttons 1440, host processor 1450, embedded controller 1460, and non-capacitance sensor elements 1470. The processing device 1410 may include analog and/or digital general purpose input/output ("GPIO") ports 1407. GPIO 1407 may be programmable. The digital block array may be configured to implement a variety of digital logic circuits (e.g., DACs, digital filters, or digital control systems) using, in one embodiment, configurable user modules ("UMs"). The digital block array may be coupled to a system bus. Processing device 1410 may also include memory, such as random access memory ("RAM") 1405 and program flash 1404. RAM 1405 may be static RAM ("SRAM"), and program flash 1404 may be a non-volatile storage, which may be used to store firmware (e.g., control algorithms executable by processing core 1402 to implement operations described herein). Processing device 1410 may also include a microcontroller unit ("MCU") 1403 coupled to memory and the processing core 1402.

As illustrated, capacitance sensor 1401 may be integrated into processing device 1410. Capacitance sensor 1401 may include analog I/O for coupling to an external component, such as capacitive sensor array 1420, touch-sensor buttons 1440, and/or other devices. Capacitance sensor 1401 and processing device 1410 are described in more detail below.

The embodiments described herein can be used in any capacitive sensor array application, for example, the capacitive sensor array 1420 may include a touch screen, a touch-sensor slider, or touch-sensor buttons 1440 (e.g., capacitance sensor buttons). The operations described herein may include, but not be limited to, notebook pointer operations, lighting control (dimmer), volume control, graphic equalizer control, speed control, or other control operations requiring gradual or discrete adjustments. It will also be noted that these embodiments of capacitive sense implementations may be used in conjunction with non-capacitive sensor elements 1470, including but not limited to pick buttons, sliders (ex. display brightness and contrast), scroll-wheels, multi-media control (ex. volume, track advance, etc) handwriting recognition and numeric keypad operation.

In one embodiment, the electronic system 1400 includes a capacitive sensor array 1420 of sensor elements coupled to the processing device 1410 via bus 1421. In an embodiment, the capacitive sensor array may include capacitive sensor elements 104 of FIG. 1 organized in scan regions 103, 105, and 107. Ground elements may be located within scan regions of the capacitive sensor array and configured to provide a ground voltage in a scanned region as described herein, for example, with respect to FIG. 2. The capacitive sensor array 1420 of the sensor elements may include a one-dimensional sensor array in one embodiment and a two dimensional sensor array such as the capacitive sensor matrix 804 of FIG. 8 in another embodiment. Alternatively or additionally, the capacitive sensor array 1420 of the sensor elements may have more dimensions. Also, in one embodiment, the capacitive sensor array 1420 of the sensor elements may be sliders, touchpads, touch screens or other sensing devices. In another embodiment, the electronic system 1400 includes touch-sensor buttons 1440 coupled to the processing device 1410 via bus 1441. Touch-sensor buttons 1440 may include a single-dimension or multi-dimension sensor array. The single- or multi-dimension sensor array may include multiple sensor elements. For a touch-sensor button, the sensor elements may be coupled together to detect a presence of a conductive object over the entire surface of the sense device. Alternatively, the touch-sensor buttons 1440 may have a single sensor element to detect the presence of the conductive object. In one embodiment, touch-sensor buttons 1440 may include a capacitive sensor element. Capacitive sensor elements may be used as non-contact sensor elements. These sensor elements, when protected by an insulating layer, offer resistance to severe environments.

The electronic system 1400 may include any combination of one or more of the capacitive sensor array 1420, and/or touch-sensor button 1440. In another embodiment, the electronic system 1400 may also include non-capacitance sensor elements 1470 coupled to the processing device 1410 via bus 1471. The non-capacitance sensor elements 1470 may include buttons, light emitting diodes ("LEDs"), and other user interface devices, such as a mouse, a keyboard, or other functional keys that do not require capacitance sensing. In one embodiment, busses 1471, 1441, 1431, and 1421 may be a single bus. Alternatively, these buses may be configured into any combination of one or more separate buses.

Processing device 1410 may include internal oscillator/clocks 1406 and communication block ("COM") 1408. The oscillator/clocks block 1406 provides clock signals to one or more of the components of processing device 1410. Communication block 1408 may be used to communicate with an external component, such as a host processor 1450, via host interface ("I/F") line 1451. Alternatively, processing device 1410 may also be coupled to the embedded controller 1460 to communicate with the external components, such as host processor 1450. In one embodiment, the processing device 1410 is configured to communicate with the embedded controller 1460 or the host processor 1450 to send and/or receive data.

Processing device 1410 may reside on a common carrier substrate such as, for example, an integrated circuit ("IC") die substrate, a multi-chip module substrate, or the like. Alternatively, the components of processing device 1410 may be one or more separate integrated circuits and/or discrete components. In one exemplary embodiment, processing device 1410 may be the Programmable System on a Chip ("PSoC®") processing device, developed by Cypress Semiconductor Corporation, San Jose, Calif. Alternatively, processing device 1410 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It will also be noted that the embodiments described herein are not limited to having a configuration of a processing device coupled to the host processor 1450, but may include a system that measures the capacitance on the sense device and sends the raw data to another host computer where it is analyzed by an application. In effect, the processing that is done by processing device 1410 may also be done in the host computer.

It is noted that the processing device 1410 of FIG. 14 may measure capacitance using various techniques, such as self-capacitance sensing and mutual capacitance sensing. The self-capacitance sensing mode is also called single-electrode sensing mode, as each sensor element needs only one connection wire to the sensing circuit. For the self-capacitance sensing mode, touching the sensor element increases the sensor capacitance as added by the finger touch capacitance is added to the sensor capacitance. The mutual capacitance change is detected in the mutual capacitance-sensing mode. Each sensor element uses at least two electrodes: one is a transmitter (TX) electrode (also referred to herein as transmitter electrode) and the other is a receiver (RX) electrode. When a finger touches a sensor element or is in close proximity to the sensor element, the capacitive coupling between the receiver and the transmitter of the sensor element is decreased as the finger shunts part of the electric field to ground (e.g., chassis or earth). In some embodiments, the processing device 1410 may provide multi-touch capability through simultaneously detecting multiple conductive objects proximate to different regions of the capacitive sensor array 1420. In an embodiment, the processing device 1410 may include and/or provide the functionality of one or more of the sensing module of FIG. 1, the transmit module 854 of FIG. 8, the receive module of FIG. 8, the measurement module of FIG. 8.

Capacitance sensor 1401 may be integrated into the IC of the processing device 1410, or alternatively, in a separate IC. The capacitance sensor 1401 may include relaxation oscillator (RO) circuitry, a sigma delta modulator (also referred to as CSD) circuitry, charge transfer circuitry, charge accumulation circuitry, or the like, for measuring capacitance as would be appreciated by one of ordinary skill in the art having the benefit of this disclosure. Alternatively, descriptions of capacitance sensor 1401 may be generated and compiled for incorporation into other integrated circuits. For example, behavioral level code describing capacitance sensor 1401, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 1401.

It will be noted that the components of the electronic system 1400 may include only some or all the discrete components described above, or some combination thereof.

In one embodiment, electronic system 1400 is used in a notebook computer. Alternatively, the electronic device may be used in other applications, such as a mobile handset, a personal data assistant ("PDA"), a keyboard, a television, a remote control, a monitor, a handheld multi-media device, a handheld video player, a handheld gaming device, or a control panel.

Example methods and apparatus to detect a conductive object have been described. Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than a restrictive sense.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document controls.

The above description is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

What is claimed is:

1. A method comprising:
    scanning a first scan region to determine a mutual capacitance indicative of a presence of a conductive object, the mutual capacitance formed between a first capacitive sensor electrode and a third capacitive sensor electrode located in the first scan region, wherein within at least one of the first capacitive sensor electrode and the third capacitive sensor electrode comprises an open interior area;
    applying, concurrent with scanning the first scan region, a ground voltage to a ground electrode located at least partially within the open interior area, wherein the ground voltage is applied to the ground electrode using a second capacitive electrode, wherein the first capacitive sensor electrode, the second capacitive sensor electrode, and the third capacitive sensor electrode are disposed in a same plane of a substrate layer; and
    detecting the presence of the conductive object using the determined mutual capacitance.

2. The method of claim 1, further comprising applying the ground voltage to another ground electrode through the second capacitive sensor electrode, the other ground electrode located in the first scan region.

3. The method of claim 1, wherein applying the ground voltage to the ground electrode comprises applying the ground voltage to the second capacitive sensor electrode.

4. The method of claim 1, further comprising:
    scanning a second scan region for the presence of the conductive object, the scanning of the second scan region comprising scanning the second capacitive sensor electrode located in the second scan region, wherein the scanning of the second capacitive sensor electrode includes applying the ground voltage to the first capacitive sensor electrode.

5. The method of claim 1, wherein the scanning of the first scan region comprises establishing the mutual capacitance between the first capacitive sensor electrode and the third capacitive sensor electrode located in the first scan region.

6. The method of claim 5, wherein establishing of the mutual capacitance comprises applying to the first capacitive sensor electrode a scan voltage that is greater than the ground voltage.

7. The method of claim 5, wherein the scanning of the first scan region comprises receiving a signal, the signal comprising:

a first current based on the mutual capacitance between the first capacitive sensor electrode and the third capacitive sensor electrode; and a second current minus a third current, the second current based on a first capacitance between the conductive object and the first capacitive sensor electrode and a second capacitance between the conductive object and the third capacitive sensor electrode, and the third current based on a capacitance between the conductive object and the ground electrode coupled to the ground voltage.

8. An apparatus comprising:

a first capacitive sensor electrode located in a first scan region;

a second capacitive sensor electrode located in a second scan region;

a third capacitive sensor electrode location in the first scan region, wherein the first scan region is scanned to determine a mutual capacitance indicative of a presence of a conductive object, wherein the mutual capacitance is formed between the first capacitive sensor electrode and the third capacitive sensor electrode, and wherein within at least one of the first capacitive sensor electrode and the third capacitive sensor electrode comprises a shape including an open interior area; and a ground electrode located in the first scan region and located at least partially within the open interior area, wherein a ground voltage is applied to the ground electrode using the second capacitive sensor electrode while the first scan region is scanned to determine the mutual capacitance between the first capacitive sensor electrode and the third capacitive sensor electrode.

9. The apparatus of claim 8, further comprising another ground electrode located in the first scan region and coupled to the second capacitive sensor electrode, the second capacitive sensor electrode to couple the ground voltage to the other ground electrode while the first scan region is scanned.

10. The apparatus of claim 8, wherein the second capacitive sensor electrode is to be coupled to the ground voltage while the first scan region is scanned.

11. The apparatus of claim 8, wherein the first capacitive sensor electrode is to be coupled to the ground voltage when the second region is scanned.

12. The apparatus of claim 8, wherein the mutual capacitance between the first capacitive sensor electrode and the third capacitive sensor electrode is established responsive to the first scan region being scanned.

13. The apparatus of claim 12, wherein the first capacitive sensor electrode is to be coupled to a scan voltage to establish the mutual capacitance, the scan voltage being greater than the ground voltage.

14. The apparatus of claim 12, wherein the third capacitive sensor electrode is to provide a signal that is based on the mutual capacitance.

15. A system comprising:

a processing device; and an input array coupled to the processing device, the processing device to scan different regions of the input array during different periods to detect a conductive object, the input array comprising:

a first capacitive sensor electrode located in a first scan region;

a second capacitive sensor electrode located in a second scan region;

a third capacitive sensor electrode located in the first scan region, wherein the first scan region is scanned to determine a mutual capacitance indicative of a presence of the conductive object, wherein the mutual capacitance is formed between the first capacitive sensor electrode and the third capacitive sensor electrode, and wherein within at least one of the first capacitive sensor electrode and the third capacitive sensor electrode comprises an open interior portion; and a ground electrode located in the first scan region and located at least partially within the open interior portion, wherein a ground voltage is applied to the ground electrode using the second capacitive sensor electrode while the processing device scans the first scan region to determine the mutual capacitance of the first capacitive sensor electrode and the third capacitive sensor electrode, wherein the processing device is to detect the presence of the conductive object using the determined mutual capacitance.

16. The system of claim 15, further comprising another ground electrode located in the first scan region and coupled to the second capacitive sensor electrode, the other ground electrode to be coupled to the ground voltage through the second capacitive sensor electrode while the processing device scans the first scan region.

17. The system of claim 15, wherein the second capacitive sensor electrode is to be coupled to the ground voltage when the processing device scans the first scan region.

18. The system of claim 15, wherein the first capacitive sensor electrode is to be coupled to the ground voltage when the processing device scans the second scan region.

19. The system of claim 15, wherein the mutual capacitance is formed between the first capacitive sensor electrode and the third capacitive sensor electrode when the processing device scans the first scan region.

20. The system of claim 19, wherein the first capacitive sensor electrode is to be coupled to a scan voltage to form the mutual capacitance, the scan voltage being greater than the ground voltage and the third capacitive sensor electrode is to provide a signal that is based on the mutual capacitance.

* * * * *